(12) United States Patent
Tabuchi et al.

(10) Patent No.: US 8,106,584 B2
(45) Date of Patent: Jan. 31, 2012

(54) LIGHT EMITTING DEVICE AND ILLUMINATION APPARATUS

(75) Inventors: Tomoya Tabuchi, Gamo-gun (JP); Akira Miyake, Gamo-gun (JP); Daisuke Sakumoto, Gamo-gun (JP)

(73) Assignee: Kyocera Corporation, Kyoto (JP)

( * ) Notice: Subject to any disclaimer, the term of this patent is extended or adjusted under 35 U.S.C. 154(b) by 554 days.

(21) Appl. No.: 11/721,807

(22) PCT Filed: Jul. 27, 2005

(86) PCT No.: PCT/JP2005/013749
§ 371 (c)(1),
(2), (4) Date: Jul. 24, 2009

(87) PCT Pub. No.: WO2006/067885
PCT Pub. Date: Jun. 29, 2006

(65) Prior Publication Data
US 2009/0295265 A1 Dec. 3, 2009

(30) Foreign Application Priority Data

Dec. 24, 2004 (JP) ................... 2004-375037
Jan. 24, 2005 (JP) ................... 2005-016054

(51) Int. Cl.
*H01J 1/62* (2006.01)
*H01L 21/00* (2006.01)
(52) U.S. Cl. ......... 313/512; 313/506; 313/507; 313/508
(58) Field of Classification Search ........... 313/498–512
See application file for complete search history.

(56) References Cited

U.S. PATENT DOCUMENTS 7,066,626 B2 6/2006 Omata
7,084,435 B2 8/2006 Sugimoto et al.
(Continued)

FOREIGN PATENT DOCUMENTS
CN 1465106 A 12/2003
(Continued)

OTHER PUBLICATIONS

Korean Unexamined Publication 10-2004-0037229, May 2004, machine_translation.*

(Continued)

*Primary Examiner* — Annie Hines
*Assistant Examiner* — Tracie Green
(74) *Attorney, Agent, or Firm* — DLA Piper LLP (US)

(57) ABSTRACT

A light emitting device includes a base on which a wiring conductor is formed from the top surface to the bottom surface or the side face; a light emitting chip mounted on the top surface of the base and electrically connected with the wiring conductor; a first light transmitting member which covers the light emitting chip; a second light transmitting member provided above the first light transmitting member to cover the first light transmitting member, the second light transmitting member being formed of a light transmitting material containing fluorescent materials for converting in wavelength the light emitted from the light emitting chip; and a third light transmitting member provided between the first and second light transmitting members, wherein the refractive index n1 of the first light transmitting member, the refractive index n2 of the second light transmitting member and the refractive index n3 of the third light transmitting member satisfy the relation: n3<n1 and n3<n2, thereby achieving higher light extraction efficiency, higher optical intensity of radiation, and higher axial luminosity and brightness.

11 Claims, 10 Drawing Sheets

U.S. PATENT DOCUMENTS

| | | |
|---|---|---|
| 7,498,734 B2 | 3/2009 | Suehiro et al. |
| 7,560,741 B2 | 7/2009 | Harle et al. |
| 2004/0066140 A1* | 4/2004 | Omoto .......................... 313/512 |
| 2004/0190304 A1 | 9/2004 | Sugimoto et al. ............. 362/555 |
| 2004/0201987 A1 | 10/2004 | Omata |
| 2004/0257797 A1 | 12/2004 | Suehiro et al. |
| 2005/0023545 A1 | 2/2005 | Camras et al. .................. 257/98 |
| 2005/0184638 A1* | 8/2005 | Mueller et al. ................ 313/485 |
| 2006/0132011 A1 | 6/2006 | Shimizu et al. ............... 313/112 |
| 2006/0163601 A1 | 7/2006 | Harle et al. |

FOREIGN PATENT DOCUMENTS

| | | |
|---|---|---|
| DE | 10308866 A1 | 9/2004 |
| EP | 1418628 A1 * | 5/2004 |
| EP | 1467417 A2 | 10/2004 |
| JP | 10-190065 | 7/1998 |
| JP | 2000-156528 | 6/2000 |
| JP | 2000-208818 | 7/2000 |
| JP | 2002-353516 | 12/2002 |
| JP | 2003-110146 | 4/2003 |
| JP | 2003-115614 | 4/2003 |
| JP | 2003234511 A | 8/2003 |
| JP | 2004-071908 | 3/2004 |
| JP | 2004-161871 | 6/2004 |
| JP | 2004-179644 | 6/2004 |
| JP | 3106800 | 11/2004 |
| JP | 2004-352928 | 12/2004 |
| JP | 2005-057266 | 3/2005 |
| JP | 2005158949 A | 6/2005 |
| WO | 2004068597 A2 | 8/2004 |

OTHER PUBLICATIONS

European search report for corresponding European application 05767041.6 lists the references above.

Chinese language office action and its English language translation for corresponding Chinese application 2005800484314.

Chinese language office action and its English language translation for corresponding Chinese application 200580048431.4 lists the references above.

Korean language office action dated Aug. 5, 2011 and its English language translation for corresponding Korean application 1020077014202 cites the foreign patent document above.

European office action for corresponding European application 0567041.6.

Chinese language office action and its English language translation for corresponding Chinese application 2008101797631.

* cited by examiner

LIGHT EMITTING DEVICE AND ILLUMINATION APPARATUS

TECHNICAL FIELD

The present invention relates to a light emitting device which can externally emit light which is converted in wavelength by fluorescent materials, from light emitted by a light emitting chip, and relates to an illumination apparatus using the same.

BACKGROUND

FIG. 18 shows a conventional light emitting device 211 which accommodates a light emitting chip 214, such as light emitting diode (LED). As sown in FIG. 18, the light emitting device has a mount portion 211a for mounting the light emitting chip 214 in the center of the top surface. The light emitting device further includes a base 212 of insulating material on which wiring conductors, such as lead terminal and metallized wiring, are formed for electrically connecting the mount portion 212a and the peripheral thereof with the interior and the exterior of the light emitting device, and a frame 213 made of metal, resin or ceramics, which is adhered onto the top surface of the base 212 and provided with a through-bore for accommodating the light emitting chip 214 in the center thereof.

The base 212 is made of ceramics, such as aluminum oxide sintered body (alumina ceramics), aluminum nitride sintered body, mullite sintered body, glass ceramics, or resin, such as epoxy resin. In the case of the base 212 being made of ceramics, metallized wiring layers are formed on the base by sintering at a high temperature metal paste including tungsten (W), molybdenum (Mo)—manganese (Mn). In the case of the base 212 being made of resin, lead terminals, made of copper (Cu) or iron (Fe)—nickel (Ni) alloy, are fixed inside the base 212 with the tip end thereof protruding when the base 212 is molded.

The frame 213, which is made of metal, such as aluminum (Al) or Fe—Ni—Co (cobalt) alloy, or ceramics, such as alumina sintered body, or resin, such as epoxy resin, is formed by machining, metallic molding or extrusion molding. In the center of the frame 213, formed is the through-bore which expands externally as it goes upward. In a case of enhancing an optical reflectivity of the inner surface of the through-bore, the inner surface is coated with metal, such as Al, using deposition or plating. The frame 213 is then adhered onto the top surface of the base 212 using soldering, such as tin solder or silver solder, or resin adhesives.

The wiring conductors (not shown) formed on the top surface of the base 212 and electrodes of the light emitting chip 214 are electrically connected with each other via boding wires (not shown). Then, after fluorescent layer 217 is formed over the light emitting chip 214, the inside of the frame 213 is filled with a thermally-cured transparent resin 215, thereby constituting a light emitting device which can externally emit light having a desired spectrum, which is converted in wavelength by fluorescent layer 217 from light emitted by the light emitting chip 214. Further, by selecting the light emitting chip 214 with an emission wavelength within an ultraviolet range of 300 to 400 nm and by adjusting the blend ratio of fluorescent material particles, exhibiting three primary colors of red, blue and green, contained in the fluorescent layer 217, color tone can be designed flexibly.

In general, the fluorescent material particles are in a powder form and it is difficult to form the fluorescent layer 217 with fluorescent materials alone, hence, the fluorescent layer 217 is typically formed by blending the fluorescent material particles into a transparent material of, e.g., resin or glass, and then coating it over the light emitting chip 214.

[PATENT DOCUMENT 1] JP 3065263, B
[PATENT DOCUMENT 2] JP 2003-110146, A

DISCLOSURE OF THE INVENTION

Problem to be Solved by the Invention

In the conventional light emitting device 211, however, either light which is converted in wavelength by the fluorescent layer 217 to go downward from the fluorescent layer 217 or light which is emitted from the light emitting chip to go downward by reflection on the upper surface of the fluorescent layer 217 is likely to reflect repeatedly inside the frame 213 to attenuate or to be absorbed into the base 212 and the light emitting chip 214. Consequently, there is a problem of optical loss being considerably increased.

Further, light which is emitted obliquely upward from the light emitting chip 214 may radiate externally with a large radiation angle from the light emitting device 211 without reflection on the frame 213. Consequently, there is also another problem of the increased radiation angle and the decreased axial luminosity.

Accordingly, the present invention is contemplated in consideration of the above-mentioned conventional problems. An object of the invention is provide a light emitting device and an illumination apparatus, which can achieving higher light extraction efficiency, higher optical intensity of radiation, and higher axial luminosity and brightness.

Means for Solving the Problem

A light emitting device according to the present invention includes:
a base on which a wiring conductor is formed from the top surface to the bottom surface or the side face thereof;
a light emitting chip mounted on the top surface of the base and electrically connected with the wiring conductor;
a first light transmitting member which covers the light emitting chip;
a second light transmitting member provided above the first light transmitting member to cover the first light transmitting member, the second light transmitting member being formed of a light transmitting material containing fluorescent materials for converting in wavelength the light emitted from the light emitting chip; and
a third light transmitting member provided between the first and second light transmitting members,
wherein the refractive index n1 of the first light transmitting member, the refractive index n2 of the second light transmitting member and the refractive index n3 of the third light transmitting member satisfy the relation: $n3<n1$ and $n3<n2$.

In the present invention, the third light transmitting member is preferably formed of a gaseous layer.

Further, in the present invention, a fourth light transmitting member having an refractive index n4 is preferably formed in contact with the lower face of the second light transmitting member, wherein the refractive indices n2 and n4 satisfy the relation: $n2>n4$.

Further, in the present invention, the first light transmitting member is preferably made of silicone resin.

Further, in the present invention, the second light transmitting member is preferably made of silicone resin containing fluorescent material.

Further, in the present invention, a reflective member is preferably adhered onto the periphery of the base so as to enclose the light emitting chip, and the reflective member has an optically-reflective inner surface.

Further, in the present invention, the upper face of the first light transmitting member preferably has a concave shape.

Further, in the present invention, the upper face of the first light transmitting member preferably has a convex shape.

Further, in the present invention, the first light transmitting member is preferably provided only on the upper face and the side face of the light emitting chip.

Further, in the present invention, the light emitting chip preferably has a main peak of emission in a near-ultraviolet or ultraviolet range.

An illumination apparatus according to the present invention employs any one of the above-described light emitting devices as a light source.

Effect of the Invention

According to the present invention, since the second light transmitting member containing fluorescent material is in contact with the third light transmitting member having an refractive index smaller than that of the second light transmitting member, both of light which is converted in wavelength by the fluorescent material in the second light transmitting member to go downward from the fluorescent material and light which is reflected downward by the upper face of the second light transmitting member can be totally reflected by the lower face of the second light transmitting member to go upward, thereby achieving higher optical intensity of radiation.

Further, external light entering the inside of the light emitting device is totally reflected by the interface between the second and third light transmitting members, thereby restraining degradation of members due to the external light, for example, degradation in strength, transmissivity and adhesive strength of the first light transmitting member.

Furthermore, since the second light transmitting member containing fluorescent material is provided to cover the first light transmitting member, all the light emitted from the light emitting chip can be converted in wavelength by the second light transmitting member, thereby achieving higher efficiency of emission. In addition, not only a portion of the second light transmitting member performs wavelength-conversion, but also the total area of the second light transmitting member can radiate wavelength-converted light, thereby preventing color variation of the light emitting face.

Further, the third light transmitting member is preferably formed of a gaseous layer having a refractive index of approximately 1.0. As compared to the case where a resin having a refractive index of approximately 1.5 is filled, both of light which is converted in wavelength by the fluorescent material in the second light transmitting member to go downward from the fluorescent material and light which is reflected downward by the upper face of the second light transmitting member can be more totally reflected by the lower face of the second light transmitting member to go upward.

Furthermore, providing the gaseous layer between the external atmosphere and the light emitting chip allows adiabatic effect, thereby restraining heat from being transferred from the external atmosphere to the light emitting chip. Consequently, variation of wavelength caused by variation of temperature of the light emitting chip can be suppressed, hence, color variation of the light radiated from the light emitting device can be prevented.

Further, since a fourth light transmitting member having a refractive index $n_4$ is formed in contact with the lower face of the second light transmitting member, even if fluorescent material particles are exposed on the lower face of the second light transmitting member, the exposed fluorescent material particles are covered by the fourth light transmitting member. Therefore, light emitted from the fluorescent material is likely to be suitably reflected by the interface between the fourth and third light transmitting members, thereby preventing optical loss.

Furthermore, since the refractive index $n_2$ of the second light transmitting member is larger than the refractive index $n_4$ of the fourth light transmitting member, reflection loss of the upward light passing through the interface between the second and fourth light transmitting members is decreased, thereby enhancing light extraction efficiency.

In addition, since the fourth light transmitting member having a refractive index, which is smaller than that of the second light transmitting member and larger than that of the third light transmitting member, is provided on the lower face of the second light transmitting member, a portion of the light which is converted in wavelength by the second light transmitting member to go downward is not reflected by the interface between the second light transmitting member containing fluorescent material and the fourth light transmitting member but travels into the fourth light transmitting member, thereby moderating scattered reflection of the light confined in the second light transmitting member.

Therefore, the scatter-reflected light does not converge in the second light transmitting member, thereby preventing optical degradation (e.g., degradation of moisture resistance, transmissivity and adhesive strength) of the second light transmitting member. Moreover, the wavelength-converted light from the second light transmitting member into the fourth light transmitting member can be effectively reflected by the interface of the gaseous layer. For example, providing a reflective member on the periphery of the second and fourth light transmitting members allows the wavelength-converted light to be effectively extracted toward the exterior of the light emitting device.

Further, the first light transmitting member is preferably made of silicone resin. Silicone resin is hardly degraded by ultraviolet light, thereby enhancing reliability of sealing and restraining aging degradation of emission efficiency.

Furthermore, the second light transmitting member is preferably made of silicone resin containing fluorescent material. Silicone resin is hardly degraded by ultraviolet light, thereby enhancing reliability of sealing and restraining aging degradation of emission efficiency.

Further, a reflective member is preferably adhered onto the periphery of the base so as to enclose the light emitting chip, and the reflective member has an optically-reflective inner surface. The light emitted from the light emitting chip is reflected by the reflective surface to be directed upward, thereby enhancing directivity of emission.

Furthermore, the reflective member is preferably formed of a thermally-conductive material, so that the heat dissipating area of the base is increased, thereby enhancing heat radiation rate of the light emitting device.

Further, the upper face of the first light transmitting member preferably has a concave shape. The interface between the first and third light transmitting members can act as a concave lens for diffusing light. The light from the light emitting chip can uniformly irradiate the whole second light transmitting member, thereby equalizing distribution of emission in the light emitting device.

Further, the upper face of the first light transmitting member preferably has a convex shape. The interface between the first and third light transmitting members can act as a convex lens for converging light. The light from the light emitting chip can effectively enter the second light transmitting member, thereby enhancing optical intensity of radiation in the light emitting device.

Further, the first light transmitting member is preferably provided only on the upper face and the side face of the light emitting chip. Most of the light from the light emitting chip is emitted out of the upper face and the side face of the light emitting chip. Hence, suppression of reflection on the upper face and the side face allows higher light extraction efficiency.

Further, the light emitting chip preferably has a main peak of emission in a near-ultraviolet or ultraviolet range. In this case, all the visible light radiated externally will originate from the light which is converted in wavelength by the fluorescent material contained in the second light transmitting member. Consequently, design of color blend ratio of light is not affected by the light from the light emitting chip, and it goes well only with adjustment of composition of the fluorescent material.

Further, an illumination apparatus according to the present invention employs the above-described light emitting device as a light source, thereby achieving higher light extraction efficiency and providing an illumination apparatus with higher optical intensity of radiation, and higher axial luminosity and brightness.

EXPLANATORY NOTE

1 LIGHT EMITTING DEVICE
2 BASE
3 FRAME
3a REFLECTIVE FACE
3b CUTOUT
4 LIGHT EMITTING CHIP
5 FIRST LIGHT TRANSMITTING MEMBER
6 FOURTH LIGHT TRANSMITTING MEMBER
7 SECOND LIGHT TRANSMITTING MEMBER
G THIRD LIGHT TRANSMITTING MEMBER
9 REFLECTIVE AUXILIARY
10 DRIVER BOARD FOR LIGHT EMITTING DEVICE
14 ELASTIC MEMBER
17 ELECTRICALLY CONDUCTIVE ADHESIVE MEMBER
18 CONDUCTIVE PATH
21 LEAD TERMINAL

BEST EMBODIMENT FOR CARRYING OUT THE INVENTION

First Embodiment

Figure 1A:
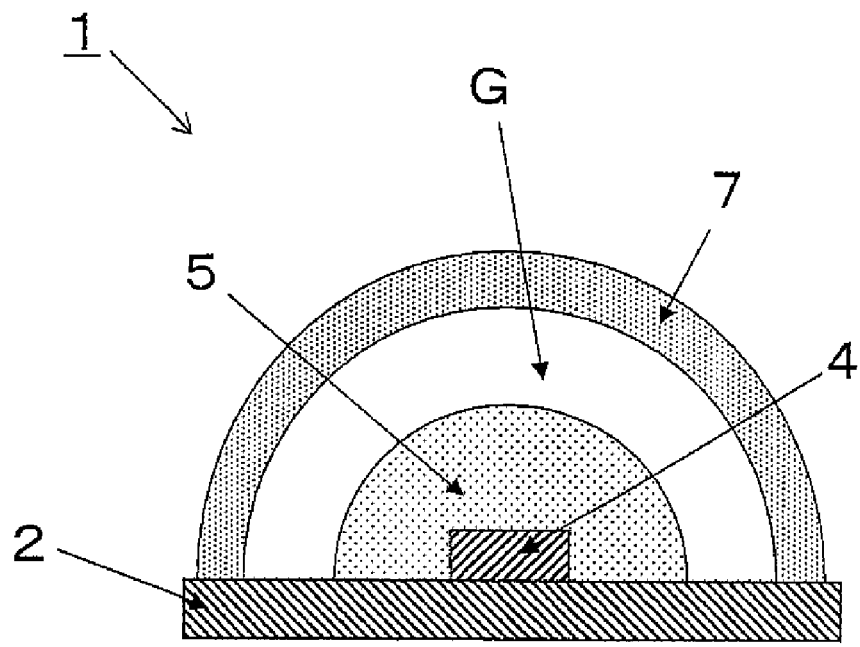
FIG. 1A is a cross-sectional view showing a first embodiment of the present invention.
Figure 1B:
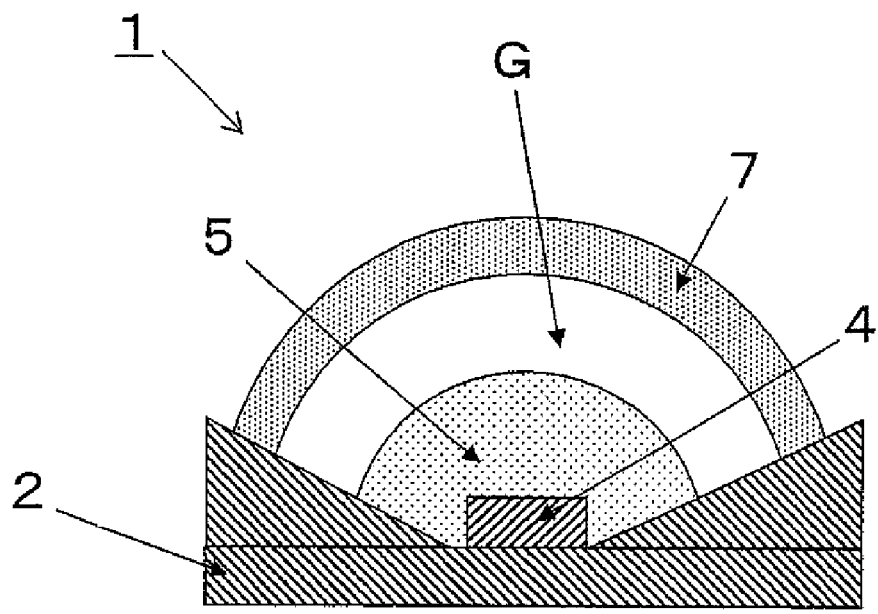
FIG. 1B is a cross-sectional view showing a first embodiment of the present invention.

FIGS. 1A and 1B are cross-sectional views showing a first embodiment of the present invention. As shown in FIG. 1, a light emitting device 1 includes a base 2, a light emitting chip 4, a first light transmitting member 5, a second light transmitting member 7, and a third light transmitting member G.

On the base 2, wiring conductors for feeding the light emitting chip 4 with an electric current are formed from the top surface to the bottom surface or the side face thereof.

The light emitting chip 4 is mounted on the top surface of base 2 to be electrically connected with the wiring conductors on the base 2.

The first light transmitting member 5 is formed of a transparent material to cover the light emitting chip 4.

The second light transmitting member 7 is formed of a transparent material containing fluorescent materials for converting in wavelength the light emitted from the light emitting chip 4 and is provided above the first light transmitting member 5 to cover the first light transmitting member 5.

The third light transmitting member G is provided between the first and second light transmitting members 5 and 7.

The first, second and third light transmitting members 5, 7 and G have a curved shape with the center of the light emitting chip 4.

In this embodiment, respective materials of the first, second and third light transmitting members 5, 7 and G is so selected that the refractive index $n1$ of the first light transmitting member 5, the refractive index $n2$ of the second light transmitting member 7 and the refractive index $n3$ of the third light transmitting member G satisfy the relation: $n3<n1$ and $n3<n2$.

Specifically, for the first light transmitting member 5, for example, silicone resin (refractive index: 1.41 to 1.52), epoxy resin (refractive index: 1.55 to 1.61), acrylic resin (refractive index: about 1.48), fluorocarbon resin (refractive index: about 1.31), polycarbonate resin (refractive index: about 1.59), polyimide resin (refractive index: about 1.68) or the like can be used.

Further, for the second light transmitting member 7, for example, silicone resin (refractive index: 1.41 to 1.52), epoxy resin (refractive index: 1.55 to 1.61), acrylic resin (refractive index: about 1.48), fluorocarbon resin (refractive index: about 1.31), polycarbonate resin (refractive index: about 1.59) or the like can be used. In addition, for the fluorescent materials contained in the second light transmitting member 7, for example, $La_2O_2S:Eu$, $LiEuW_2O_8$, $ZnS:Ag$, $SrAl_2O_4:Eu$, $ZnS:CuAl$, $ZnCdS:Ag$, $ZnS:Cu$, $(BaMgAl)_{10}O_{12}:Eu$, $SrCaS:Eu$, $(Sr, Ca, Ba, Mg)_{10}(PO_4)_6Cl_2:Eu$ or the like can be used.

Furthermore, for the third light transmitting member G, for example, silicone resin, epoxy resin, fluorocarbon resin or the like can be used. Alternatively, the third light transmitting member G can be formed of a gaseous layer, such as air. In each of these cases, the material is so selected to satisfy the relation: $n3<n1$ and $n3<n2$. In the case where the light emitted from the light emitting chip has a main peak of emission in a range of ultraviolet to near-ultraviolet, for example, it is preferable to use a silicone resin which has a high transmissivity in a range of ultraviolet to near-ultraviolet and endurance against yellowing and strength degradation. In this case, for the first and second light transmitting members 5 and 7 used is a silicone resin having a refractive index of 1.52, and for the third light transmitting member G used is another silicone resin having a refractive index of 1.41, thereby achieving the emitting element device according to the present invention.

With such a constitution, since the second light transmitting member 7 containing fluorescent material is in contact with the third light transmitting member G having an refractive index smaller than that of the second light transmitting member 7, most of both of light which is converted in wavelength by the fluorescent material in the second light transmitting member 7 to go downward from the fluorescent material and light which is reflected downward by the upper face of the second light transmitting member 7 can reflected via total reflection by the lower face of the second light transmitting member 7 to go upward.

Further, most of external light entering the inside of the light emitting device is reflected via total reflection by the interface between the second and third light transmitting members 7 and G, thereby restraining degradation of members due to the external light, for example, degradation in strength, transmissivity and adhesive strength of the first light transmitting member 5.

Furthermore, since the second light transmitting member 7 containing fluorescent material is provided to cover the first light transmitting member 5, all the light emitted from the light emitting chip 4 can be converted in wavelength by the second light transmitting member 7, thereby achieving higher efficiency of emission.

Further, the third light transmitting member G is preferably formed of a gaseous layer having a refractive index of approximately 1.0. As compared to the case where a resin having a refractive index of approximately 1.5 is filled, most of both of light which is converted in wavelength by the fluorescent material in the second light transmitting member 7 to go downward from the fluorescent material and light which is reflected downward by the upper face of the second light transmitting member 7 can be more reflected by the lower face of the second light transmitting member 7 to go upward.

Furthermore, providing the gaseous layer as the third light transmitting member G between the external atmosphere and the light emitting chip 4 allows adiabatic effect, thereby restraining heat from being transferred from the external atmosphere to the light emitting chip 4. Consequently, variation of wavelength caused by variation of temperature of the light emitting chip 4 can be suppressed, hence, color variation of the light radiated from the light emitting device can be prevented.

In this embodiment, it is preferable that the third light transmitting member G has a substantially constant thickness. The thickness of the third light transmitting member G corresponds to the distance between the upper face of the first light transmitting member 5 and the lower face of the second light transmitting member 7, which preferably has a tolerance of 15% throughout.

If there is irregularities on the upper and lower faces of the third light transmitting member G with the thickness thereof being not substantially constant optical refraction may occur on the upper and lower faces, resulting in variation of distribution of light intensity. Hence, the substantially constant thickness of the third light transmitting member G can suppress the variation of distribution of light intensity when the light enters the second light transmitting member 7 out of the first light transmitting member 5. Consequently, distribution of amount of the wavelength-converted light from the second light transmitting member 7 can be substantially even, thereby preventing color variation or fluctuation of the light emitting face.

Next, in FIG. 1B, the shape of the base 2 is modified to render the upper face thereof for mounting the light emitting chip 4 flat and to form a circular conic face which extends obliquely upward from the upper face thereof for mounting the light emitting chip 4 toward the periphery. Providing the tilting face allows the light emitted from the light emitting chip to be directed upward, thereby enhancing utilization efficiency of light.

Second Embodiment

Figure 2:
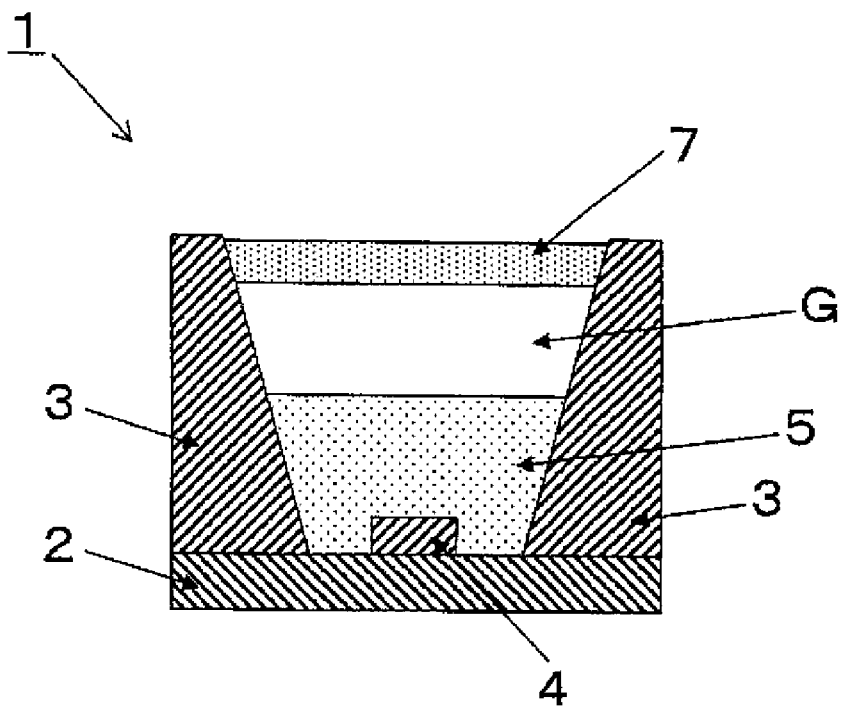
FIG. 2 is a cross-sectional view showing a second embodiment of the present invention.

FIG. 2 is a cross-sectional view showing a second embodiment of the present invention. A light emitting device 1 includes a base 2, a frame 3, a light emitting chip 4, a first light transmitting member 5, a second light transmitting member 7, and a third light transmitting member G.

On the base 2, wiring conductors for feeding the light emitting chip 4 with an electric current are formed from the top surface to the bottom surface or the side face thereof.

The light emitting chip 4 is mounted on the top surface of base 2 to be electrically connected with the wiring conductors on the base 2.

The frame 3 is fixed onto the base 2 and is provided with an inner face tilting upward to enclose the light emitting chip 4. The inner face of the frame 3 preferably has light reflectivity with regard to utilization efficiency of light.

The first light transmitting member 5 is formed of a transparent material to cover the light emitting chip 4.

The second light transmitting member 7 is formed of a transparent material containing fluorescent materials for converting in wavelength the light emitted from the light emitting chip 4 and is provided above the first light transmitting member 5 to cover the first light transmitting member 5.

The third light transmitting member G is provided between the first and second light transmitting members 5 and 7.

The first, second and third light transmitting members 5, 7 and G have a flat interfaces with a multilayer constitution substantially parallel to the top surface of the base 2.

In this embodiment, respective materials of the first, second and third light transmitting members 5, 7 and G is so selected that the refractive index n1 of the first light transmitting member 5, the refractive index n2 of the second light transmitting member 7 and the refractive index n3 of the third light transmitting member G satisfy the relation: n3<n1 and n3<n2. Specific materials as listed above in the above-described embodiment can be used such that any combination of these materials can satisfy the relation: n3<n1 and n3<n2.

With such a constitution, since the second light transmitting member 7 containing fluorescent material is in contact with the third light transmitting member G having an refractive index smaller than that of the second light transmitting member 7, most of both of light which is converted in wavelength by the fluorescent material in the second light transmitting member 7 to go downward from the fluorescent material and light which is reflected downward by the upper face of the second light transmitting member 7 can reflected via total reflection by the lower face of the second light transmitting member 7 to go upward.

Further, most of external light entering the inside of the light emitting device is reflected via total reflection by the interface between the second and third light transmitting members 7 and G, thereby restraining degradation of members due to the external light, for example, degradation in strength, transmissivity and adhesive strength of the first light transmitting member 5.

Furthermore, since the second light transmitting member 7 containing fluorescent material is provided to cover the first light transmitting member 5, all the light emitted from the light emitting chip 4 can be converted in wavelength by the second light transmitting member 7, thereby achieving higher efficiency of emission.

Further, the third light transmitting member G is preferably formed of a gaseous layer having a refractive index of approximately 1.0. As compared to the case where a resin having a refractive index of approximately 1.5 is filled, most of both of light which is converted in wavelength by the fluorescent material in the second light transmitting member 7 to go downward from the fluorescent material and light which is reflected downward by the upper face of the second light transmitting member 7 can be more reflected by the lower face of the second light transmitting member 7 to go upward.

Furthermore, providing the gaseous layer as the third light transmitting member G between the external atmosphere and the light emitting chip 4 allows adiabatic effect, thereby restraining heat from being transferred from the external atmosphere to the light emitting chip 4. Consequently, variation of wavelength caused by variation of temperature of the light emitting chip 4 can be suppressed, hence, color variation of the light radiated from the light emitting device can be prevented.

In this embodiment, it is preferable that the third light transmitting member G has a substantially constant thickness. The thickness of the third light transmitting member G corresponds to the distance between the upper face of the first light transmitting member 5 and the lower face of the second light transmitting member 7, which preferably has a tolerance of ±5% throughout.

If there is irregularities on the upper and lower faces of the third light transmitting member G with the thickness thereof being not substantially constant optical refraction may occur on the upper and lower faces, resulting in variation of distribution of light intensity. Hence, the substantially constant thickness of the third light transmitting member G can suppress the variation of distribution of light intensity when the light enters the second light transmitting member 7 out of the first light transmitting member 5. Consequently, distribution of amount of the wavelength-converted light from the second light transmitting member 7 can be substantially even, thereby preventing color variation or fluctuation of the light emitting face.

Third Embodiment

Figure 3A:
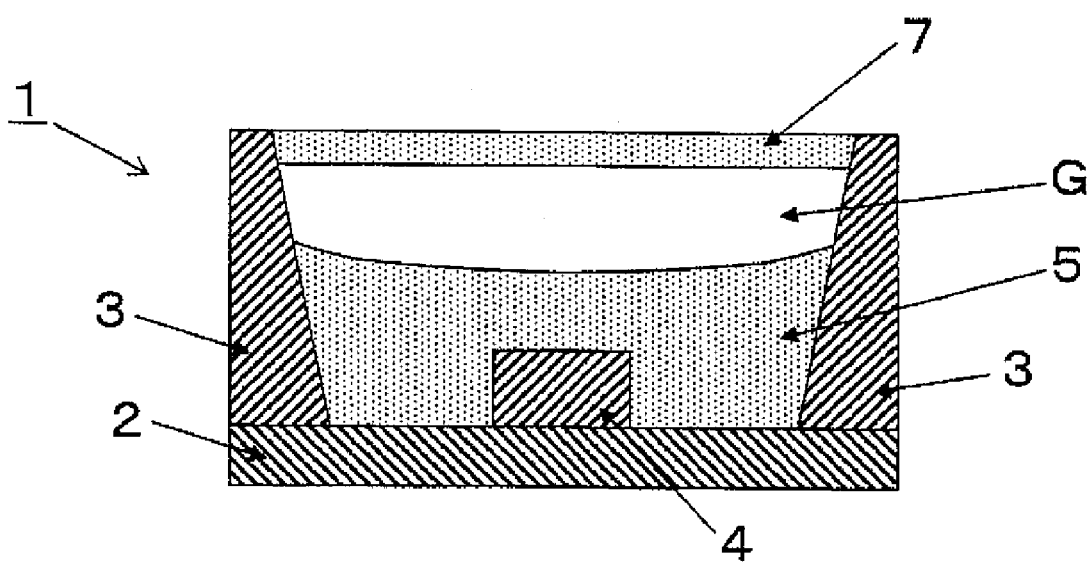
FIG. 3A is a cross-sectional view showing a third embodiment of the present invention.
Figure 3B:
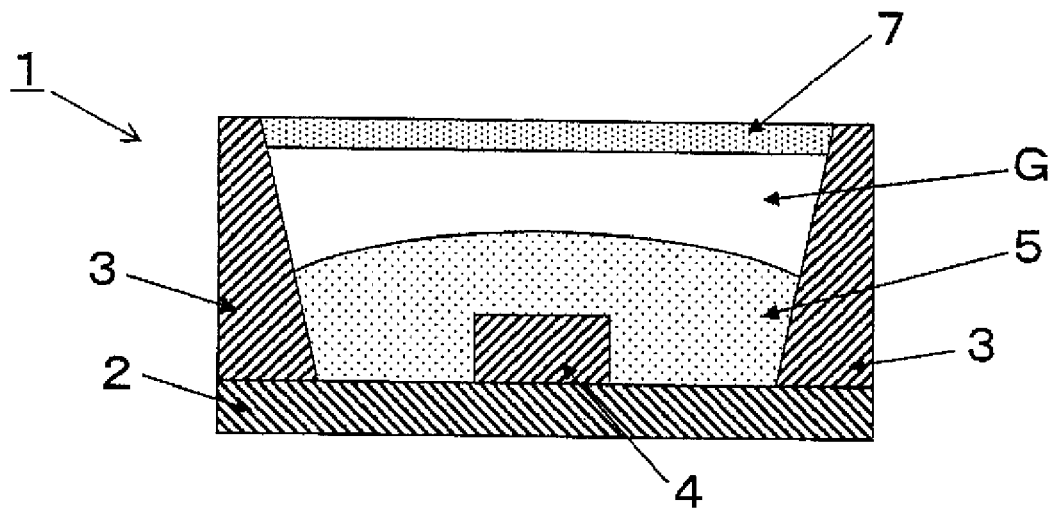
FIG. 3B is a cross-sectional view showing a third embodiment of the present invention.

FIGS. 3A and 3B are cross-sectional views showing a third embodiment of the present invention. A light emitting device 1 includes a base 2, a frame 3, a light emitting chip 4, a first light transmitting member 5, a second light transmitting member 7, and a third light transmitting member G.

On the base 2, wiring conductors for feeding the light emitting chip 4 with an electric current are formed from the top surface to the bottom surface or the side face thereof.

The light emitting chip 4 is mounted on the top surface of base 2 to be electrically connected with the wiring conductors on the base 2.

The frame 3 is fixed onto the base 2 and is provided with an inner face tilting upward to enclose the light emitting chip 4. The inner face of the frame 3 preferably has light reflectivity with regard to utilization efficiency of light.

The first light transmitting member 5 is formed of a transparent material to cover the light emitting chip 4.

The second light transmitting member 7 is formed of a transparent material containing fluorescent materials for converting in wavelength the light emitted from the light emitting chip 4 and is provided above the first light transmitting member 5 to cover the first light transmitting member 5.

The third light transmitting member G is provided between the first and second light transmitting members 5 and 7.

In this embodiment, respective materials of the first, second and third light transmitting members 5, 7 and G is so selected that the refractive index n1 of the first light transmitting member 5, the refractive index n2 of the second light transmitting member 7 and the refractive index n3 of the third light transmitting member G satisfy the relation: n3<n1 and n3<n2. Specific materials as listed above in the above-described embodiment can be used such that any combination of these materials can satisfy the relation: n3<n1 and n3<n2. This relation, as described above, can enhance utilization efficiency of light.

Further, as shown in FIG. 3A, it is preferable that the lower face of the first light transmitting member 5, the upper face of the second light transmitting member 7, and the interface between the second and third light transmitting members 7 and G are substantially parallel to the top surface of the base 2, and the upper face of the first light transmitting member 5 preferably has a concave shape. The interface between the first and third light transmitting members 5 and G can act as a concave lens for diffusing light. The light from the light emitting chip 4 can uniformly irradiate the whole second light transmitting member 7, thereby equalizing distribution of emission in the light emitting device 1.

Alternatively, as shown in FIG. 3B, the upper face of the first light transmitting member 5 preferably has a convex shape. The interface between the first and third light transmitting members 5 and G can act as a convex lens for converging light. The light from the light emitting chip 4 can effectively enter the second light transmitting member 7, thereby enhancing optical intensity of radiation in the light emitting device 1.

Specific examples will be described below.

Example 11

An alumina ceramic substrate with a width of 15 mm, a depth of 15 mm and a thickness of 1 mm was prepared, on which wiring conductors were formed from the top surface for mounting a light emitting chip to the outer surface of the base.

The base for mounting a light emitting chip was provided with a pair of circular pads on the top surface for connecting with the electrodes of the light emitting chip. Each pad was formed of a metallized layer by sintering a powder of Mo—Mn.

Then, on each of the surfaces of the pair of circular pads, a Ni plated layer having a thickness of 3 μm and an Au plated layer having a thickness of 3 μm were sequentially deposited using electrolytic plating.

Then, on the top surface of the above base, a frame-like light reflecting member of Al (aluminum) with dimensions of 15 mm×15 mm×thickness 5 mm and a surface chemical polished was attached using an adhesive of acrylic resin to enclose the light emitting chip. The light reflecting member was provided with a through-bore having an inner diameter $\phi_1$ of 5 mm at the lower plane, an inner diameter $\phi_2$ of 10 mm at the upper plane and an inner face linearly expanding as going upward to form a tilting face.

Next, a light emitting chip of a nitride-based compound semiconductor with dimensions of 0.35 mm×0.35 mm×thickness 0.1 mm, which can emit near-ultraviolet light having a peak wavelength of 405 nm, was adhered using Ag paste to connect the pair of electrodes thereof with the above-described circular pads.

Then, the first light transmitting member 5 of a silicone resin having a refractive index n1=1.41 was dropped using a dispenser and heat-cured inside the light reflecting member to have a thickness of 2.5 mm for covering the light emitting chip.

Meanwhile, the plate-like second light transmitting member 7 with a thickness of 0.5 mm and a refractive index n2=1.55, which was composed of an epoxy resin containing $La_2O_2S$:Eu (red fluorescent material), ZnS:CuAl (green fluorescent material) and $(BaMgAl)_{10}O_{12}$:Eu (blue fluorescent material), was formed. The second light transmitting member was positioned above the first light transmitting member 5 to cover the first light transmitting member 5 and adhered to the light reflecting member, thereby constituting the light emitting device. The first and second light transmitting members 5 and 7 were arranged to secure a space of 2 mm, and the space could act as the third light transmitting member G with a refractive index n3=1, similarly to the following example.

Example 12

Another light emitting device was constituted similarly to Example 11 except that a plate-like fourth light transmitting member 6 of a silicone resin with a thickness of 0.5 mm and a refractive index n4=1.41 was made in contact with the lower face of the second light transmitting member 7. This example was different from Example 11 in that the refractive index n4 of the fourth light transmitting member 6 was smaller that the refractive index n2 of the second light transmitting member 7.

Comparative Example 11

Still another light emitting device was constituted similarly to Example 12 except that the internal space of the light emitting device, which was defined by both of the inner face of the light reflecting member and the second light transmitting member 7, was filled with the first light transmitting member 5 to omit the third and fourth light transmitting member G and 6.

The total amount of luminous flux of respective Examples 11 and 12 and Comparative example 11 was measured, indicating that the total amount of luminous flux of Example 11 was approximately 3% larger than that of Comparative example 11, and the total amount of luminous flux of Example 12 was approximately 7% larger than that of Comparative example 11, with a result that Examples 11 and 12 had better emission efficiency as compared to Comparative example 11.

Fourth Embodiment

Figure 4:
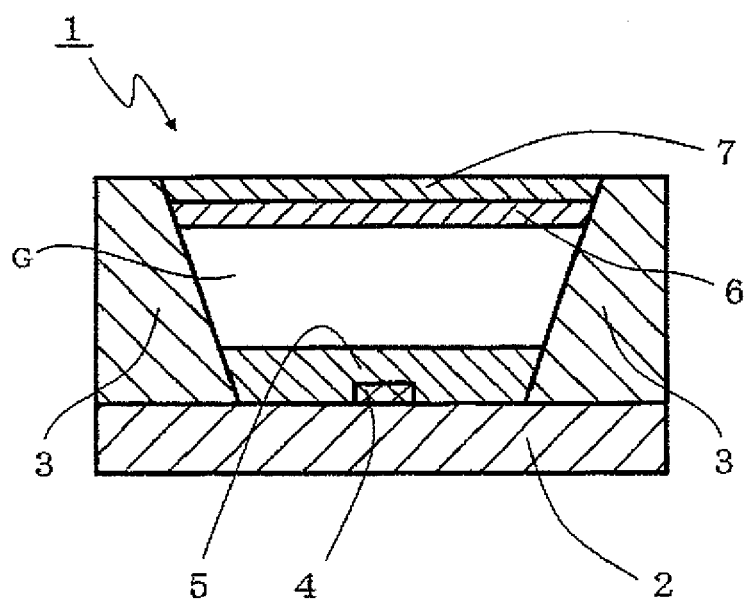
FIG. 4 is a cross-sectional view showing a fourth embodiment of the present invention.

FIG. 4 is a cross-sectional view showing a fourth embodiment of the present invention. A light emitting device 1 includes a base 2, a frame 3, a light emitting chip 4, a first light transmitting member 5, a second light transmitting member 7, a third light transmitting member G, and a fourth light transmitting member 6.

The base 2, which is formed of ceramics, such as alumina ceramics, aluminum nitride sintered body, mullite sintered body, glass ceramics, or resin, such as epoxy resin, or metal, functions as a support member for supporting the light emitting chip 4.

In the case of the base 2 being made of ceramics, wiring conductors (not shown) for electrically connecting the light emitting chip 4 are formed on the top surface and the periphery of the base 2. The wiring conductors are led out to the outer surface of the base 2 to be connected with an external electric circuit board, so that the light emitting chip 4 and the external electric circuit board are electrically connected to each other.

When connecting the light emitting chip 4 with the wiring conductors, either wire bonding (not shown) or flip chip bonding for connecting the bottom face of the light emitting chip 4 via a solder bump can be used. In particular, flip chip bonding is preferable, because the wiring conductor can be located under the light emitting chip 4 to dispense with any space for locating the wiring conductor around the light emitting chip 4 on the top surface of the base 2, thereby suitably preventing light emitted from the light emitting chip 4 from being absorbed by a space for wiring conductors with a lowered optical intensity of radiation, hence, downsizing the light emitting device 1.

In the case of the base 2 being made of ceramics, the wiring conductor is formed of a metallized layer including a metallic powder, such as W, Mo, Cu, silver (Ag). Alternatively, input/output terminals which is configured of an insulator having wiring conductors thereon may be provided by fitting with a through-bore of the base 2. Whereas, in the case of the base 2 being made of resin, lead terminals, e.g., made of Fe—Ni—Co alloy, are embedded inside the base 2.

On the exposed surface of the wiring conductor, a corrosive-resistant metal, such as Ni, gold (Au), may be deposited with a thickness of 1 to 20 μm in order to suitably prevent oxidation corrosion of the wiring conductor and to secure robust connection between the light emitting chip 4 and the wiring conductor. Accordingly, it is preferable that, on the exposed surface of the wiring conductor, for example, a Ni plated layer having a thickness of 1 to 10 μm and an Au plated layer having a thickness of 0.1 to 3 μm are sequentially deposited using electrolytic plating or electroless plating.

The frame 3, which is made of metal, such as Al, Fe—Ni—Co alloy, or ceramics, such as alumina ceramics, or resin, such as epoxy resin, is formed by machining, metallic molding or extrusion molding.

The inner surface of the frame 3 preferably has an arithmetic mean roughness Ra of 0.1 μm or below, thereby allowing light from the light emitting chip 4 to reflect upward. In a case of Ra exceeding 0.1 μm, the light cannot be reflected upward by the inner surface of the frame 3 and is likely to be reflected diffusely inside the light emitting device 1. Consequently, the light emitting device 1 has larger optical transmission loss and it is difficult for light to radiate externally with a desired radiation angle.

The second light transmitting member 7 is formed of a transparent material, such as epoxy resin, silicone resin, acrylic resin or glass containing fluorescent materials exhibiting, e.g., three primary colors of red, blue and green, which is applied or placed onto the upper face of the second light transmitting member. For the fluorescent materials, various particulate materials, e.g., red fluorescent material of $La_2O_2S:Eu$ (Eu-doped $La_2O_2S$), green fluorescent material of ZnS:CuAl, blue fluorescent material of $(BaMgAl)_{10}O_{12}$:Eu or the like, can be used. Each of these fluorescent materials is not limited to a single type, and blending plural types of materials with any percentage allows light having desired emission spectra and colors to radiate.

The second light transmitting member 7 preferably has a thickness of 0.1 to 1 mm, thereby achieving effective wavelength conversion of the light emitted from the light emitting chip 4. In a case of the fluorescent layer 7 having a thickness of less than 0.1 mm, the major part of the light emitted from the light emitting chip 4 may pass through the fluorescent layer 7 without wavelength conversion, thereby lowering wavelength conversion efficiency. In another case of the thickness exceeding 1 mm, the wavelength-converted light may be absorbed into the fluorescent layer 7, thereby lowering optical intensity of radiation.

The first light transmitting member 5 is formed to cover the light emitting chip 4. The first light transmitting member 5 is preferably made of a material which exhibits smaller difference in refractive index between the first light transmitting member 5 and the light emitting chip 4, and higher transmissivity from a ultraviolet range to a visible range, for example, a transparent resin, such as silicone resin, epoxy resin, or low-melting glass or sol-gel glass. Hence, optical reflection loss caused by the difference in refractive index between the first light transmitting member 5 and the light emitting chip 4 can be effectively prevented.

The first light transmitting member 5 is preferably made of silicone resin. Silicone resin is hardly degraded by the light, such as ultraviolet light, emitted from the light emitting chip 4, thereby achieving the light emitting device with enhanced reliability of sealing.

Figure 5:
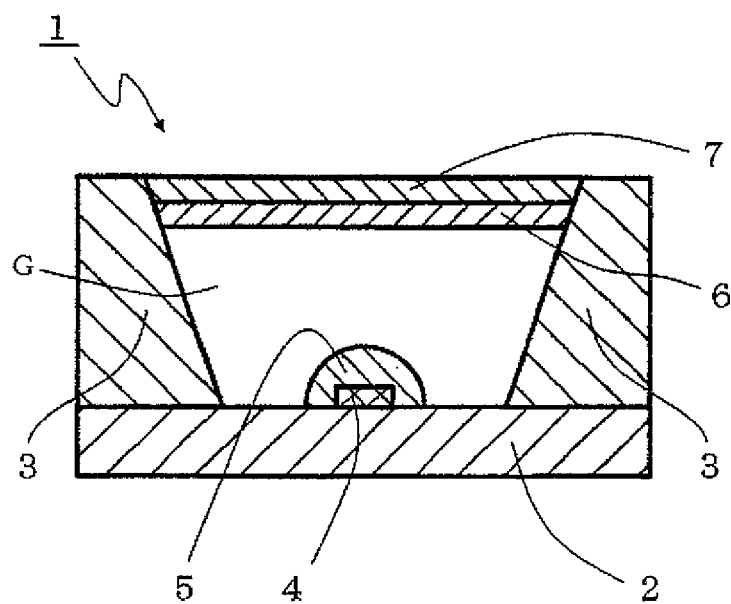
FIG. 5 is a cross-sectional view showing an example of a first light transmitting member having a hemispheric shape.

Further, as shown in FIG. 5, the first light transmitting member 5 preferably has a hemispheric shape. Hence, the propagating direction of the light from the light emitting chip 4 is perpendicular to the upper face of the first light transmitting member 5, thereby effectively extracting the light without total reflection on the upper face of the first light transmitting member 5 and achieving the light emitting device 1 with higher optical intensity of radiation.

Furthermore, for the third light transmitting member G, for example, silicone resin, epoxy resin, fluorocarbon resin or the like can be used. Alternatively, the third light transmitting member G can be formed of a gaseous layer, such as air. In each of these cases, the material is so selected to satisfy the relation: n3<n1 and n3<n2. In the case where the light emitted from the light emitting chip has a main peak of emission in a range of ultraviolet to near-ultraviolet, for example, it is preferable to use a silicone resin which has a high transmissivity in a range of ultraviolet to near-ultraviolet and endurance against yellowing and strength degradation. In this case, for the first and second light transmitting members 5 and 7 used is a silicone resin having a refractive index of 1.52, and for the third light transmitting member G used is another silicone resin having a refractive index of 1.41, thereby achieving the emitting element device according to the present invention.

The fourth light transmitting member 6 is preferably formed on the lower face of the second light transmitting member 7. Hence, even if fluorescent material is exposed on the lower face of the second light transmitting member 7, the exposed fluorescent material is covered by the fourth light transmitting member 6. Therefore, light emitted from the fluorescent material is likely to be suitably totally reflected by the lower face of the fourth light transmitting member 6 to go upward, thereby preventing light, which may be directly emitted through a space from the fluorescent material, from being absorbed into the base 2 and the light emitting chip 4 and achieving the emitting element device with enhanced light extraction efficiency.

The fourth light transmitting member 6 is preferably located with a space to cover the first light transmitting member 5, and preferably made of a material exhibiting higher transmissivity from a ultraviolet range to a visible range. Providing the fourth light transmitting member 6 with a space to cover the first light transmitting member allows the light broadly emitted from the upper face of the first light transmitting member 5 to travel upward perpendicularly to the base 2 when entering the lower face of the fourth light transmitting member 6. Hence, optical path length of light passing through the second light transmitting member 7 can be substantially equalized throughout the second light transmitting member 7 to effectively prevent color variation due to difference in efficiency of wavelength conversion, therefore, light is likely to radiate directionally along the axis of the light emitting device 1, thereby enhancing optical intensity of radiation, and axial luminosity and brightness.

Since the lower face of the fourth light transmitting member 6 is in contact with the third light transmitting member G of, e.g., an air layer having a lower refractive index, the major part of either light which is emitted downward by the fluorescent material in the second light transmitting member 7 or light which is reflected downward by the upper face of the second light transmitting member 7 can be totally reflected by the lower face of the fourth light transmitting member 6, thereby effectively preventing the light from being attenuated by repeated reflection inside the frame 2 or absorbed into the base 2 and the light emitting chip 4, and effectively preventing reduction of light extraction efficiency.

Incidentally, it is sufficient that the third light transmitting member G, i.e., the space between the first light transmitting member 5 and the second light transmitting member 7 or the space between the first light transmitting member 5 and the fourth light transmitting member 6, has a refractive index small than that of the first light transmitting member 5, the fourth light transmitting member 6 or the second light transmitting member 7 constituting the fluorescent layer the third light transmitting member G is not necessarily an air layer, but may be any other gaseous layer or another layer of a light transmitting member having a lower refractive index.

The fourth light transmitting member 6 is preferably made of a material which exhibits smaller difference in refractive index between the fourth light transmitting member 6 and the second light transmitting member 7 and higher transmissivity from a ultraviolet range to a visible range, for example, a transparent resin, such as silicone resin, epoxy resin, or low-melting glass or sol-gel glass. The fourth light transmitting member 6 is preferably made of the same material as the second light transmitting member 7 constituting the fluorescent layer. Hence, light can suitably pass through the interface between the second light transmitting member 7 and the fourth light transmitting member 6 with lower optical loss. In addition, delamination of the members 6 and 7 caused by stress due to difference in coefficient of thermal expansion between the second light transmitting member 7 and the fourth light transmitting member 6 can be effectively prevented.

The first light transmitting member 5 is preferably made of silicone resin. Silicone resin is hardly degraded by the light, such as ultraviolet light, emitted from the light emitting chip 4, thereby achieving the light emitting device with enhanced reliability of sealing.

Moreover, the thickness of the first light transmitting member 5, the space (i.e., gap clearance) between the first light transmitting member 5 and the second light transmitting member 7, the space (i.e., gap clearance) between the first light transmitting member 5 and the fourth light transmitting member 6, and the thickness of the fourth light transmitting member 6 may be appropriately selected in consideration of reflection efficiency on the interface between the first light transmitting member 5 and the second light transmitting member 7 or the interface between the first light transmitting member 5 and the fourth light transmitting member 6.

Figure 7:
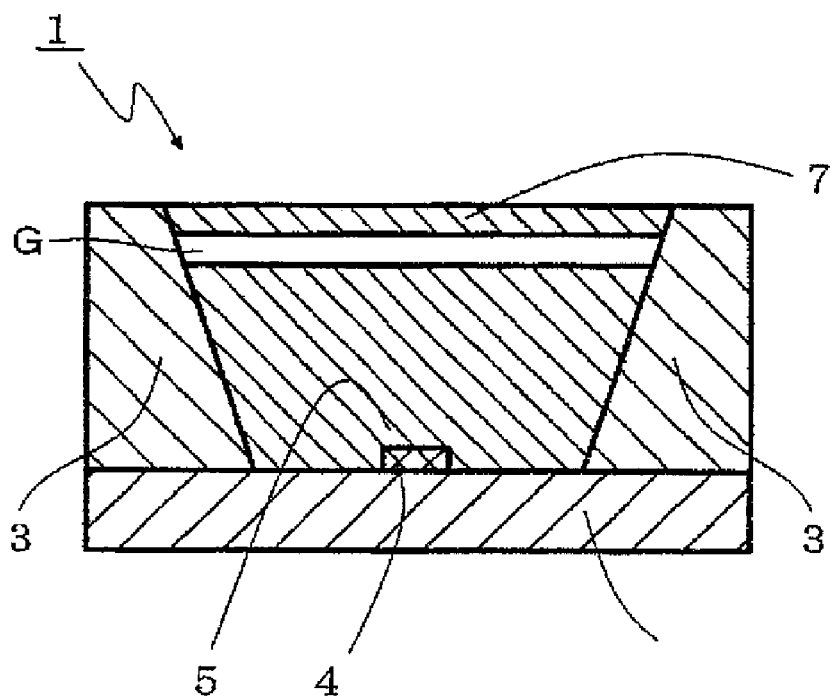
FIG. 7 is a cross-sectional view showing an example of a thin third light transmitting member.

On the assumption that the light emitting device has the same height, it is preferable that, as shown in FIG. 7, the thickness of the third light transmitting member G, that is, either the space (i.e., gap clearance) between the first light transmitting member 5 and the second light transmitting member 7, or the space (i.e., gap clearance) between the first light transmitting member 5 and the fourth light transmitting member 6 is smaller than that of the first light transmitting member 5. Hence, thermal expansion of the space can be reduced and stress due to the thermal expansion of the space can be sufficiently absorbed into the first light transmitting member 5, thereby effectively preventing variation of emission of the light emitting chip 4 subject to the stress.

Meanwhile, in view of reduction of optical loss, on the assumption that the light emitting device has the same height, it is preferable that the total thickness of the first and second light transmitting member 5 and 6 (or the thickness of the first light transmitting member 5 in case of lacking the second light transmitting member 6) is smaller than the gap clearance (i.e., either the space between the first and second light transmitting members 5 and 6 or the space between the first and second light transmitting members 5 and 7). Hence, large part of the air layer having higher transmissivity can be secured in the optical path through which the light emitted from the light emitting chip 4 passes outward, thereby suppressing optical transmission loss caused by confinement in the light emitting device or repeated diffuse reflection.

Figure 6:
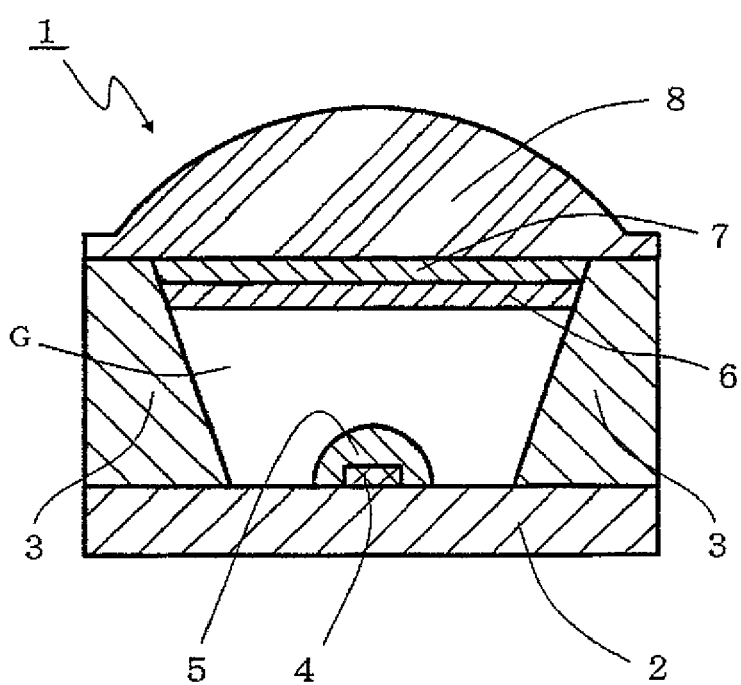
FIG. 6 is a cross-sectional view showing an example of a lens-like cover mounted.

Further, as shown in FIG. 6, on the upper face of the frame 3, a cover 8 made of transparent material, such as glass, sapphire, quartz, or resin (plastics), such as epoxy resin, silicone resin, acrylic resin, polycarbonate resin, polyimide resin may be fixedly mounted. In this case, the cover can protect the light emitting chip 4, wiring conductors, bonding wires, the first and fourth light transmitting members 5 and 7 located inside the frame 3, and can constitute a hermetic seal to secure stable operation of the light emitting chip 4 in the long term. In addition, the cover 8 may be formed in a lens shape to act as an optical lens, so that light can converge or diverge with a desired radiation angle and distribution of intensity to be extracted outside the light emitting device 1.

Moreover, as to arrangement of the light emitting device 1 according to the present invention, a single light emitting device can be located with a desired arrangement as a light source, or a plurality of light emitting devices can be located with a lattice, stagger or radial arrangement or a plurality of groups of light emitting devices can be located concentrically with a circular or polygonal arrangement as a light source, so as to constitute the illumination apparatus according to the present invention, thereby achieving higher light extraction efficiency, higher optical intensity of radiation, and higher axial luminosity and brightness.

Further, the semiconductor light emitting chip 4 utilizes emission due to electronic recombination, thereby providing the illumination apparatus with lower power consumption, longer operating life, less heating and a smaller size, as compared to conventional discharging system. Consequently, variation of center wavelength of the light emitted from the light emitting chip 4 can be suppressed, and light illumination with stable optical intensity of radiation and angle of radiation (distribution of light) can be realized in the long term, and color variation and deviation of distribution of illumination on the illumination plane can be suppressed.

Incidentally, the illumination apparatus according to the present invention may be constituted not only by locating a plurality of light emitting devices 1 with a predefined arrangement but also by locating a single of light emitting device 1 with a predefined arrangement.

Specific examples will be described below.

Example 21

First, an alumina ceramic substrate was prepared for the base 2. The base 2 was a rectangular parallelepiped with dimensions of 5 mm width×8 mm depth× of 0.5 mm thickness.

Wiring conductors were formed from the top surface for mounting the light emitting chip 4 to the outer surface of the base 2. Each of the wiring conductors on the top surface of the base 2 for mounting the light emitting chip 4 was made of a metallized layer of a powder of Mo—Mn with a shape of a circular pad having a diameter of 0.1 mm, on which a Ni plated layer having a thickness of 3 μm was deposited. The wiring conductors located inside the base 2 were formed of electric connections of through-conductors, that is, through-holes. The through-holes were also made of metallized layers of a powder of Mo—Mn.

Next, the base 2 and the frame 3 were adhered to each other using adhesives, and then the first light transmitting member 5 of an epoxy resin having a refractive index of 1.61 was placed inside the frame 3 with a hemispheric shape having a radius of 0.4 mm to cover the light emitting chip 4. Then, the plate-like fourth light transmitting member 6 of a silicone resin having a refractive index of 1.41 and a thickness of 0.1 mm was adhered to the inner face of the frame 3 to cover the first light transmitting member 5 with a space of 1.1 mm as measured vertically from the zenith of the hemispheric shape. Next, the upper face of the fourth light transmitting member 6 was covered with the second light transmitting member 7, which was composed of a transparent material of a silicone resin containing $La_2O_2S$:Eu for red fluorescent material, ZnS:CuAl for green fluorescent material and $(BaMgAl)_{10}O_{12}$:Eu for blue fluorescent material, to constitute the light emitting device 1 according to the present invention.

Comparative Example 21

Meanwhile, for Comparative example 21, another light emitting device was constituted similarly to Example 21 except that the internal space of the frame 3 was filled with the first light transmitting member 5 having a thickness of 1.5 mm.

The total amount of luminous flux of both Example 21 and Comparative example 21 was measured, indicating that the total amount of luminous flux of Example 21 was approximately 10% larger than that of Comparative example 21, with a result that Example 21 was better than Comparative example 21.

Fifth Embodiment

Figure 8:
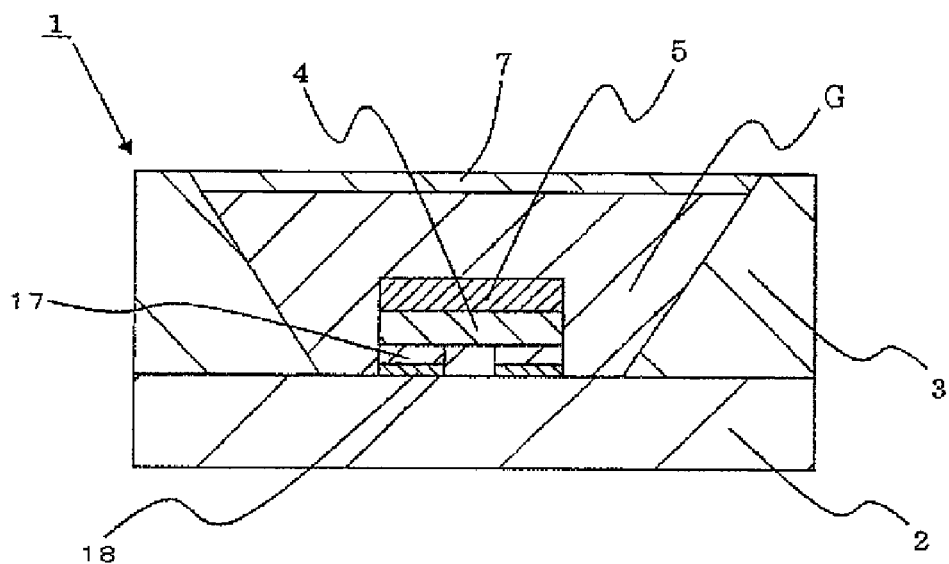
FIG. 8 is a cross-sectional view showing a fifth embodiment of the present invention.
Figure 9:
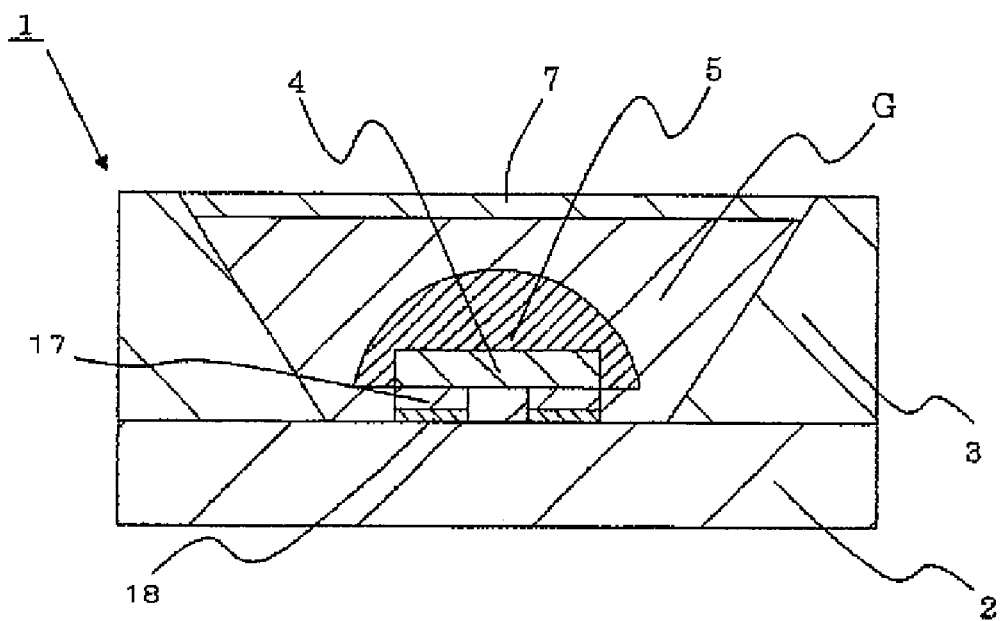
FIG. 9 is a cross-sectional view showing an example of a light transmitting member having a hemispheric shape.
Figure 10:
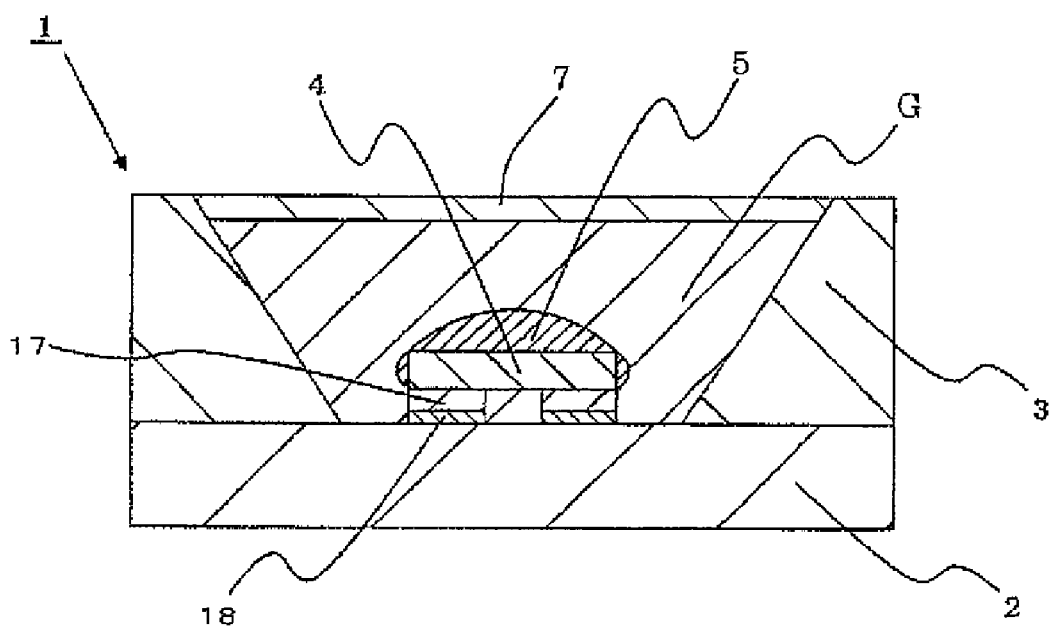
FIG. 10 is a cross-sectional view showing an example of a light transmitting member having a curved face.

FIGS. 8 to 10 are cross-sectional views showing a fifth embodiment of the present invention. A light emitting device 1 includes a base 2, a light emitting chip 4, a first light transmitting member 5, a second light transmitting member 7, and a third light transmitting member G.

The base 2, which is formed of ceramics, such as alumina ceramics, aluminum nitride sintered body, mullite sintered body, glass ceramics, or resin, such as epoxy resin, or metal, functions as a support member for supporting the light emitting chip 4.

In the case of the base 2 being made of ceramics, wiring conductors (not shown) for electrically connecting the light emitting chip 4 are formed on the top surface and the periphery of the base 2. The wiring conductors are led out to the outer surface of the base 2 to be connected with an external electric circuit board, so that the light emitting chip 4 and the external electric circuit board are electrically connected to each other.

The first light transmitting member 5 is made of a transparent material to cover the upper face of the light emitting chip 4.

The second light transmitting member 7, which is made of a transparent material containing fluorescent materials for converting in wavelength the light emitted by the light emitting chip 4, is located above the first light transmitting member 5 to cover the first light transmitting member 5.

The third light transmitting member G is provided between the first and second light transmitting members 5 and 7.

In this embodiment, respective materials of the first, second and third light transmitting members 5, 7 and G is so selected that the refractive index n1 of the first light transmitting member 5, the refractive index n2 of the second light transmitting member 7 and the refractive index n3 of the third light transmitting member G satisfy the relation: n3<n1 and n3<n2. Specific materials as listed above in the above-described embodiment can be used such that any combination of these materials can satisfy the relation: n3<n1 and n3<n2. This relation, as described above, can enhance utilization efficiency of light.

Further, as shown in FIGS. 8 to 10, on the top surface and the inside of the base 2, electrically-conducting paths 13, which are metallized of a metallic powder of W, Mo, Mn, etc, are formed for electric connection between the interior and exterior of the light emitting device 1. Electrodes of the light emitting chip 4 are connected to exposed portions of the conducting paths 18 on the base 2. Meanwhile, externally exposed portions of the conducting paths 18 on the bottom surface of the base 2 are connected through lead terminals of, e.g., a metal, such as Cu, Fe—Ni alloy, to an external electric circuit. Consequently, the light emitting chip 4 is electrically connected through the electrically-conducting paths 18 to the external electric circuit.

On the exposed surface of the electrically-conducting path 18, a corrosive-resistant metal, such as Ni, gold (Au), may be deposited with a thickness of 1 to 20 μm in order to suitably prevent oxidation corrosion of the electrically-conducting path 18 and to secure robust electric connections between the light emitting chip 4 and the electrically-conducting path 18 and between the electrically-conducting path 18 and an electrically-conducting adhesive 17. Accordingly, it is preferable that, on the exposed surface of the electrically-conducting path 18, for example, a Ni plated layer having a thickness of 1 to 10 μm and an Au plated layer having a thickness of 0.1 to 3 μm are sequentially deposited using electrolytic plating or electroless plating.

The frame 3, which is made of metal, such as aluminum (Al), Fe—Ni—Co (cobalt) alloy, or ceramics, such as alumina sintered body, or resin, such as epoxy resin, is formed by machining, metallic molding or extrusion molding. In the center of the frame 3, formed is a through-bore which expands externally as it goes upward. The inner wall of the through-bore constitutes a reflective surface.

Such a reflective surface can be formed by smoothing the inner wall thereof using machining or molding technique, such as metallic molding or extrusion molding, or by depositing the inner wall thereof with a metal, such as Al, using vacuum evaporation or plating technique. Then, the frame 3 is adhered onto the top principal surface of the base 2 using soldering, such as tin solder or silver solder, or resin adhesives.

The light emitting chip 4, as shown in FIGS. 8 to 10, is mounted on the base 2 using flip chip bonding via the electrically-conducting adhesive 17, such as Au—Sn eutectic solder, so as to be connected with the electrically-conducting path 18 on the top surface of the base 2. Alternatively, the light emitting chip 4 may be mounted on the base 2 using inorganic adhesives, such as solder, sol-gel glass, low-melting glass, or organic adhesives, such as epoxy resin, and then the electrodes of the light emitting chip 4 may be electrically connected via bonding wires to the electrically-conducting paths 18.

Next, as shown in FIGS. 8 to 10, in the case of the light emitting chip 4 being mounted on the electrically-conducting path 18, it is preferable that, under the lower face of the light emitting chip 4, the first light transmitting member 5 does not exist, but the third light transmitting member G of, e.g., silicone resin having a refractive index smaller than that of the first light transmitting member 5 is located. Hence, the light emitted from the light emitting chip 4 is likely to pass out of the upper or side face, which has a smaller difference in refractive index, of the light emitting chip 4 toward the first light transmitting member 5, instead of passing out of the lower face, which has a larger difference in refractive index, of the light emitting chip 4 toward the third light transmitting member G. Consequently, reduction of emission efficiency due to absorption of the light emitted from the light emitting chip 4 into the electrically-conducting adhesive 17, made of a solder containing Au, such as Au—Sn alloy, for connecting the electrode located on the bottom of the light emitting chip with the electrically-conducting path 18 can be effectively prevented.

In FIG. 8, on the upper face of the light emitting chip 4 located is the first light transmitting member 5, above which the second light transmitting member is located to cover the whole first light transmitting member. Hence, the light emitted from the light emitting chip 4 can travel upward to avoid absorption into the electrically-conducting adhesive 17, and satisfying the relation: n3<n1 and n3<n2 allows the light from the light emitting chip 4 to effectively radiate.

In FIGS. 9 and 10, the upper and side faces of the light emitting chip 4 are covered with the first light transmitting member 5. Hence, the light emitted from the light emitting chip 4 can travel upward and sideward to avoid absorption into the electrically-conducting adhesive 17, and satisfying the relation: n3<n1 and n3<n2 allows the light from the light emitting chip 4 to effectively radiate.

Further, in FIGS. 8 to 10, the third light transmitting member G is preferably formed of a gaseous layer. As compared to the case where a transparent material, such as resin, is located under the light emitting chip 4 for the third light transmitting member G, thermal expansion due to heat generated from the light emitting chip 4 does not occur in the third light transmitting member G located under the light emitting chip 4, thereby preventing detachment of the light emitting chip 4 from the electrically-conducting path 18 due to stress caused by thermal expansion of the third light transmitting member G, and securing good electric conduction to stably operate the light emitting device.

The second light transmitting member 7 is formed to cover all the first light transmitting member 5, for example, by molding the second light transmitting member 7 of a transparent material containing fluorescent materials with a desired shape, followed by mounting it above the first light transmitting member 5 with a space, alternatively, by applying the third light transmitting member G of, e.g., silicone resin, onto the first light transmitting member 5 with a desired thickness and then thermally curing it, followed by blending a transparent material with fluorescent materials to obtain a liquid precursor of wavelength conversion member, and then applying it using a dispenser to locate the second light transmitting member 7 on the third light transmitting member G, and then curing it in an oven.

Further, it is easy and preferable to attach in advance the first light transmitting member 5 on the light emitting chip 4 before the light emitting chip 4 is adhered to the base 2. For example, on a wafer of a transparent substrate, such as sapphire, semiconductor layers of, e.g., n-type and p-type gallium nitrides, are epitaxially grown for forming a light emitting layer, and then electrodes are formed to obtain a wafer including the light emitting chips 4. The sapphire wafer is then attached on a support member, such as UV-cure film, and then a liquid precursor of light transmitting member for the first light transmitting member 5 is applied onto the wafer using spin coating or spraying to coat a large number of the light emitting chips 4 with the first light transmitting member 5 at one time. Subsequently, the sapphire wafer is divided into chips using a dicer, and then the chip is mounted on the base 2 to easily obtain the light emitting chip 4 having the first light transmitting member 5 thereon with low cost and good reproducibility.

Alternatively, after dividing the above-described wafer including the light emitting chips 4, each of the light emitting chips 4 is kept apart from each other, and then the first light transmitting member 5 is located around each of the light emitting chips 4 at one time, so that the first light transmitting member 5 easily covers the upper and side faces of the light emitting chip 4 with low cost and good reproducibility.

In another case where the first light transmitting member 5 is formed after the respective light emitting chips 4 is mounted on a package for accommodating light emitting chip, if defective devices as the first light transmitting member 5 has an undesired thickness are produced, the light emitting chips 4 as well as package for accommodating light emitting chip will be wasted. Since the first light transmitting member 5 is attached in advance on the light emitting chip 4 before the light emitting chip 4 is adhered to the base 2, the above-mentioned waste can be prevented to enhancing yield ratio of production.

Moreover, in this embodiment, as shown in FIG. 9, with regard to the first light transmitting member 5, at least one portion of the surface covering the light emitting chip 4 is preferably formed with a curved shape, more preferably, the whole shape of the first light transmitting member 5 may be a hemisphere having the center of balance of the emission area of the light emitting chip 4 in the center thereof. Hence, the propagation direction of the light emitted from the light emitting chip 4 into the first light transmitting member 5 becomes substantially perpendicular to the interface between the first and third light transmitting member 5 and G, thereby remarkably decreasing a probability of the light being reflected by the interface.

The hemispheric first light transmitting member 5 can be formed by coating the upper and side faces of the light emitting chip 4 with a liquid precursor of a transparent material, and then by utilizing surface tension acting on the corners of the light emitting chip 4 to easily obtain such a hemisphere having the center of the light emitting chip 4, and then by curing it to form the first light transmitting member 5. Incidentally, it is sufficient that the first light transmitting member 5 is formed with a shape as similar to a hemisphere as possible based on the rectangular parallelepiped of the light emitting chip 4, wherein the above-mentioned hemisphere may include such a curved shape of distorted hemisphere as shown in FIG. 10.

Moreover, as to arrangement of the light emitting device 1 according to the present invention, a single light emitting device can be located with a desired arrangement as a light source, or a plurality of light emitting devices can be located with a lattice, stagger or radial arrangement or a plurality of groups of light emitting devices can be located concentrically with a circular or polygonal arrangement as a light source, so as to constitute the illumination apparatus according to the present invention. Further, the semiconductor light emitting chip 4 utilizes emission due to electronic recombination, thereby providing the illumination apparatus with lower power consumption, longer operating life, less heating and a smaller size, as compared to conventional discharging system. Consequently, variation of center wavelength of the light emitted from the light emitting chip 4 can be suppressed, and light illumination with stable optical intensity of radiation and angle of radiation (distribution of light) can be realized in the long term, and color variation and deviation of distribution of illumination on the illumination plane can be suppressed.

Sixth Embodiment

Figure 11:
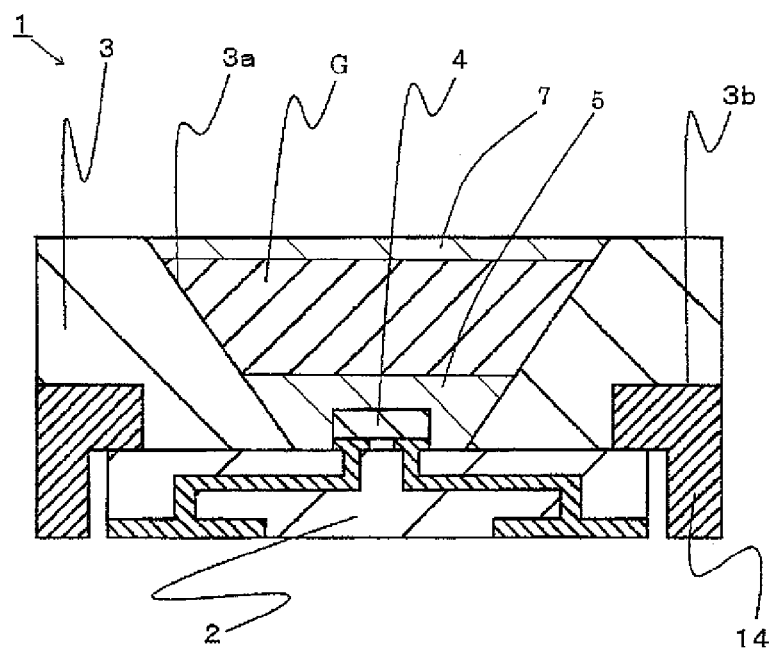
FIG. 11 is a cross-sectional view showing a sixth embodiment of the present invention.
Figure 12:
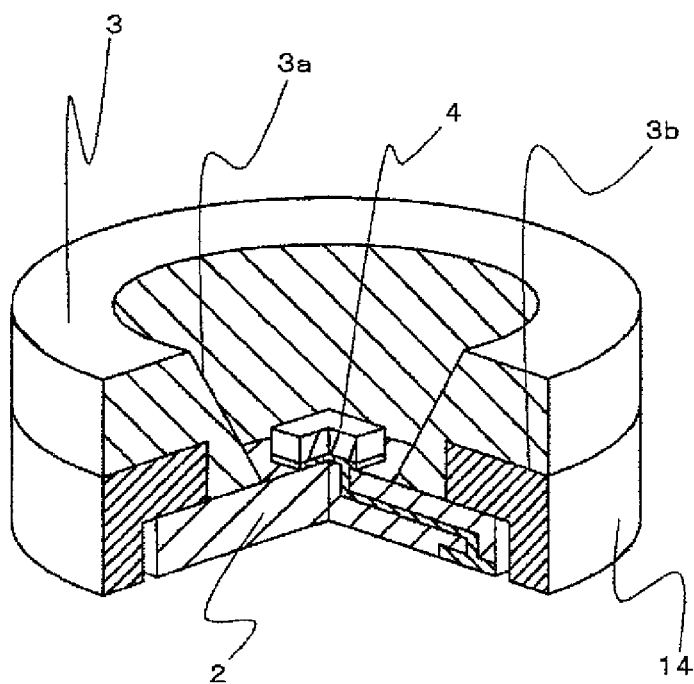
FIG. 12 is a fractured perspective view in which each of light transmitting members is omitted in the light emitting device shown in FIG. 11.

FIG. 11 is a cross-sectional view showing a sixth embodiment of the present invention. A light emitting device 1 includes a base 2, a frame 3, a light emitting chip 4, a first light transmitting member 5, a second light transmitting member 7, a third light transmitting member G, and an elastic member 14 to constitute a package for accommodating light emitting chip as a whole.

The frame 3 is fixed onto the base 2 and is provided with an optical reflective face 3a enclosing the light emitting chip 4. A cutout 3b is further formed on the outer periphery and the lower face of the frame 3.

The elastic member 14 is a ring-like member having a cross section of an inverted "L" with the upper portion thereof embedded in the cutout 3b and the lower portion thereof located laterally to the base 2.

The first light transmitting member 5 is formed of a transparent material to cover the light emitting chip 4.

The second light transmitting member 7 is formed of a transparent material containing fluorescent materials for converting in wavelength the light emitted from the light emitting chip 4 and is provided above the first light transmitting member 5 to cover the first light transmitting member 5.

The third light transmitting member G is provided between the first and second light transmitting members 5 and 7.

In this embodiment, respective materials of the first, second and third light transmitting members 5, 7 and G is so selected that the refractive index n1 of the first light transmitting member 5, the refractive index n2 of the second light transmitting member 7 and the refractive index n3 of the third light transmitting member G satisfy the relation: n3<n1 and n3<n2. Specific materials as listed above in the above-described embodiment can be used such that any combination of these materials can satisfy the relation: n3<n1 and n3<n2. This relation, as described above, can enhance utilization efficiency of light.

The base 2 functions both as a support member for supporting and mounting the light emitting chip 4 and as a cooling member for dissipating heat from the light emitting chip 4. On the top surface of the base 2 mounted is the light emitting chip 4 via resin adhesives, tin (Sn)—lead (Pb) solder, low melting solder, such as Au—Sn, or the like. Heat from the light emitting chip 4 is transferred through the resin adhesive or the low melting solder into the base to effectively dissipate to the exterior, thereby maintaining good operation of the light emitting chip 4. Further, the light emitted from the light emitting chip 4 is reflected by the reflective face 3a to radiate externally.

The base 2 is made of ceramics, such as aluminum oxide sintered body (alumina ceramics), aluminum nitride sintered body, glass ceramics. Wiring conductors are formed to extend from the vicinity of the top surface of the base 2 for mounting the light emitting chip 4 to the outside of the package for accommodating light emitting chip.

The wiring conductor on the base 2 is formed of a metallized layer of, e.g., W, Mo, Mn, Cu, for example, by mixing a powder of W with an organic solvent or a solvent to obtain a metallic paste, and then by printing, applying and sintering it on the base 2 with a predetermined pattern. In order to prevent oxidation and to secure robust connection with boding wires, it is preferable that, on the surface of the wiring conductor, a metal layer, e.g., a Ni layer having a thickness of 0.5 to 9 μm and/or an Au layer having a thickness of 0.5 to 5 μm are deposited using plating technique.

The frame 3 is formed on the top surface of the base 2 to enclose the light emitting chip 4. The cutout 3b is formed on the outer periphery and the lower face of the frame 3. The frame 3 is made of metal, such as Al, stainless steel (SUS), Ag, Fe (iron)—Ni—Co (cobalt) alloy, Fe—Ni alloy, or resin or ceramics. In the case of the frame 3 being of metal, the inner face can be mirror finished using polishing to obtain the optical reflective face 3a which can suitably reflect visible light emitted from the light emitting chip 4.

In other case of the frame 3 being of resin or ceramics, the inner face can be provided with a metal layer using plating or vacuum evaporation to obtain the optical reflective face 3a which can suitably reflect visible light emitted from the light emitting chip 4. The frame 3 is preferably made of Al or SUS in view of easy production of the reflective face 3a having a higher reflectivity on the visible light from the light emitting chip 4 and prevention of oxidation corrosion.

Furthermore, in the case of the frame being of metal, an ingot of the material can be machined using well-known conventional metal machining technique, e.g., cutting, rolling or punching, to form a predetermined shape.

The elastic member 14 according to the present invention, is made of a material having a longitudinal elastic modulus small than that of the frame 3. The longitudinal elastic modulus of the elastic member 14 is preferably fifth part or below of the longitudinal elastic modulus of the frame 3. Since the elastic member 14 has a longitudinal elastic modulus small than that of the frame 3, if the base 2 and the frame 3 will be applied repeatedly with heat generated from the operating light emitting chip 4 or variation of temperature of external atmosphere so that the base 2 and the frame 3 will expand or shrink, the elastic member 14 can effectively relieve stress caused by distortion to remarkably decrease the effect on the frame 3.

The elastic member 14 is fixed to the frame 3 so that the upper portion thereof is embedded in the cutout 3b of the frame 3 and the lower portion thereof is located laterally to the base 2. It is preferable that the elastic member 14 is made of thermosetting resin having high heat resistance, such as epoxy resin, liquid crystal polymer (LCP), or thermoplastic resin, and has a longitudinal elastic modulus of 10 to 20 MPa. Since the elastic member 14 has the above longitudinal elastic modulus, the elastic member 14 can act as a buffer, hence, if the base 2 will be applied repeatedly with heat generated from the operating light emitting chip 4 or variation of temperature of external atmosphere, larger thermal stress can be suppressed, thereby effectively preventing cracking of the base 2 or delamination of the base 2 and the frame 3.

Consequently, poor electric connection of the wiring conductor, e.g., breaking of wiring, can be prevented, and a constant pattern of luminous flux (light beam) which is reflected by the frame 3 and emitted from the light emitting chip 4 can be achieved with a stable angle of optical radiation and a desired value or pattern of distribution of optical intensity which can be expressed by a single of luminous flux or a group thereof.

Meanwhile, in another case of the elastic member 14 having a longitudinal elastic modulus exceeding 70 MPa, it is difficult to relieve stress caused in the base 2 and the frame 3 when the light emitting chip 4 generates heat. In yet another case of the elastic member 14 having a longitudinal elastic modulus of less than 5 MPa, it is difficult for the elastic member 14 to support the frame so that the frame 3 is not stably fixed on the base 2, Therefore, the longitudinal elastic modulus of the elastic member 14 is preferably in a range of 5 to 70 MPa, more preferably, in a range of 10 to 20 MPa.

Further, as shown in FIG. 11, in the case where the elastic member 14, which has a thermal conductivity lower than that of the frame 3, is adhered to the top surface of the base 2, thermal conduction from the base 2 to the frame 3 can be preferably suppressed by the elastic member having a lower thermal conductivity to effectively prevent the frame 3 from being distorted due to heat. Even if the base will be distorted by heat of the light emitting chip 4, the elastic member 14 which is adhered to both of the base 2 and the frame 3 can relieve stress die to distortion, thereby remarkably decreasing the effect on the frame 3. Therefore, there is no variation of distribution of intensity of light radiated from the package for accommodating light emitting chip or illumination distribution on the illumination plane, thereby supplying stable light and stably operating the light emitting device in the long term with high reliability.

Figure 13:
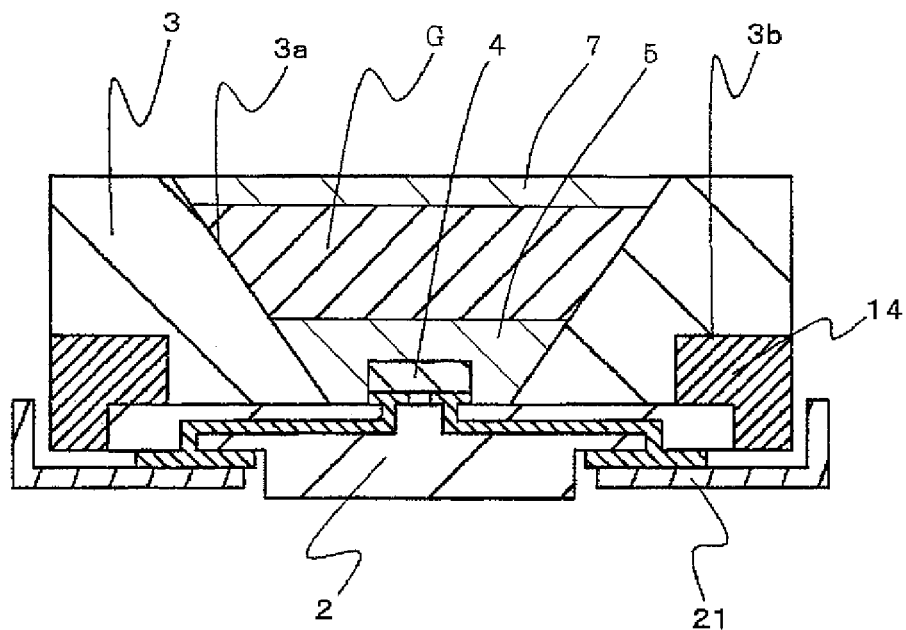
FIG. 13 is a cross-sectional view showing an example of L-shaped lead terminals being provided on the bottom surface of a base.

Further, in order to connect the package for accommodating light emitting chip to an external connection board, an external connection terminal may be located on the bottom surface of the base 2 with a tip end thereof protruding outwardly from the base 2 as in a plan view, or a connection pad formed on the bottom face of the base 2 may be provided directly with electrically conductive adhesive. Among above, as shown in FIG. 13, for example, in the case where L-shaped lead terminals 21 are located on the bottom surface of the base 2 and the elastic member 14 for the external connection terminals, even if the L-shaped lead terminals 21 will collide with the base due to stress caused by heat of the light emitting chip 4, the L-shaped lead terminals 21 can make in contact with the elastic member 14 located laterally to the base 2 to prevent contact with the base 2, or even if collision will occur, the stress can be relieved by the elastic member 14, thereby effectively preventing chipping, breaking or cracking of the base 2 due to contact between the L-shaped lead terminals 21 and the base 2. Consequently, the light emitting chip 4 can be accommodated in an airtight manner and can normally and stably operate in the long term.

Furthermore, in the case of the L-shaped lead terminals 21 being located on the bottom face of the base 2, as shown in FIG. 13, it is preferable that a step is created so that the joint area of the lead terminal 21 is located with a position higher than the center of the base 2n and the L-shaped lead terminal 21 is fixed to the step. Providing the L-shaped lead terminal 21 at the step can prevent short-circuiting between the external connection board and the L-shaped lead terminal 21.

In the case where a connection pad formed on the bottom face of the base 2 is provided directly with electrically conductive adhesive to couple the package for accommodating light emitting chip with the external connection board, even if the melting conductive adhesive will protrude out of the gap between the external connection board and the package for accommodating light emitting chip to crawl upward along the base 2, the conductive adhesive cannot come in contact with the frame 3, because the elastic member 14 according to the present invention is located in an area which the frame 3 has occupied in a conventional device. Hence, even if the frame 3 is of metal, it is difficult for the conductive adhesive to come in contact with the frame 3, thereby effectively preventing short-circuiting.

In another case of the base 2 being ceramic, since the elastic member 14 is fixed to the frame 3 so that the lower portion thereof is located laterally to the base 2, light leaking outward from the side face of the ceramic base 2 can be blocked by the lower portion of the elastic member 14 located laterally to prevent external leakage. Consequently, the light emitting device according to the present invention is used for a display device with no blurring and good visibility.

It is preferable that a gap is provided between the lower portion of the elastic member 14 and the side face of the base 2, thereby prompting exhaust of heat generated from the light emitting chip 4 and passing through the base 2 out of the gap between the base 2 and the elastic member 14. In addition, preferably, enhanced exhaust of heat can prevent the light emitting chip 4 from being degraded and can effectively suppress heat-deformation of the package for accommodating light emitting chip.

It is more preferable that the cutout 3b of the frame 3 is annularly located along the outer periphery of the frame 3. Hence, there is an outdoor air layer having a large capacity between the base 2 and the frame 3 as compared to lack of the cutout 3b, thereby effectively preventing heat generated from the operating light emitting chip 4 from being transferred from the base 2 to the frame 3. Consequently, no bending moment may occur between the frame 3 and the base 2, thereby effectively preventing cracking or breaking of the base 2.

In addition, the volume of the frame 3 becomes smaller and the contact area between the base 2 and the frame 3 becomes smaller to suppress stress concentrated into the joint area of the base 2 and the frame 3 by heat generated from the light emitting chip 4 when the light emitting device is operated, thereby effectively preventing cracking or delamination in the base 2 or the joint area of the base 2 and the frame 3.

Since the elastic member 14 is annularly located along the outer periphery of the frame 3, in the case where, in order to connect the package for accommodating light emitting chip to an external connection board, an external connection terminal is located on the bottom surface of the base 2 with a tip end thereof protruding outwardly from the base 2 as in a plan view, even if the external connection board will be displaced in any position due to stress caused by heat of the light emitting chip 4, stress caused by collision of the elastic member 14 with the base 2 can preferably be relieved by the annularly located elastic member 14. Consequently, chipping, breaking or cracking of the base 2 or the periphery of the base 2 can be effectively prevented, so that the light emitting chip 4 can be accommodated in an airtight manner and can normally and stably operate in the long term.

The elastic member 14 is preferably adhered only to the upper face of the cutout 3b of the frame 3. Hence, the frame can be easily deformed to suitably relieved of restraint from the elastic member 14. Consequently, even if the elastic member 14 or the base will be distorted, distortion of the frame 3 can be effectively prevented. Further, it is preferable that there is a gap between the portion located inside the elastic member 14 on the lower face of the frame 3 and the top surface of the base 12, thereby interrupting transfer of heat from the base to the reflective face 3a.

Further, it is preferable that the reflective face 3a is tilted with an angle of 35 to 70 degrees with respect to the top surface of the base 2. Hence, light from the light emitting chip 4 mounted on the top surface of the base 2 can be suitably reflected by the tilting reflective face 3a to suitably radiate externally with a radiation angle of less than 45 degrees, thereby remarkably enhancing emission efficiency, luminance and brightness of the light emitting device including the package for accommodating light emitting chip according to the present invention. Incidentally, the optical radiation angle is defined as an angle of light diverging on a plane which passes the center of the light emitting chip 4 perpendicularly to the base 2. When the opening shape in a horizontal cross section of the frame is circular, the radiation angle remains constant along all the circumference of the reflective face 3a. When the opening shape in a horizontal cross section of the frame is prolate, such as ellipsoid, the radiation angle is defined as the maximum value.

In a case of the reflective face 3b is tilted with less than 35 degrees with respect to the top surface of the base 2, the radiation angle exceeds 45 degrees and the amount of the diverging light is increased, resulting in decreased luminance and brightness. Meanwhile, in another case of the radiation angle exceeding 70 degrees, the light emitted from the light emitting chip 4 cannot suitably radiate externally from the package for accommodating light emitting chip, and the light is likely to reflect diffusely inside the package for accommodating light emitting chip.

In a case of the shape of the reflective face 3a being an inverted cone, the angle measured between the reflective face 3a and the top surface of the base 2 is preferably in a range of 35 to 70 degrees along all the circumference. In another case of the shape of the reflective face 3a being a quadrangular pyramid, at least one pair of opposite inner faces is preferably tilted with an angle of 35 to 70 degrees with respect to the top surface of the base 2, resulting in enhanced emission efficiency.

The reflective face 3a preferably has an arithmetic mean roughness Ra of 0.004 to 4 µm. In a case of the reflective face 3a having an arithmetic mean roughness Ra exceeding 4 µm, the light emitted from the light emitting chip 4 accommodated in the package for accommodating light emitting chip cannot be specularly reflected to radiate upward from the package for accommodating light emitting chip, thereby causing attenuation or deviation of optical intensity. In another case of the reflective face 3a having an arithmetic mean roughness Ra of less than 0.004 µm, it is difficult to stably and effectively form such a face, resulting in higher cost of production. The reflective face 3a having Ra in the above-described range can be formed using well-known conventional electric polishing, chemical polishing or machining, as well as transferring with profile regularity of a mold.

Further, for joining the frame 3 to the elastic member 14 or joining the frame 3 to the base 2, silicone-based or epoxy-based resin adhesives, or metal solder, such as Ag—Cu solder, or solder, such as Pb—Au—Sn—Au—Sn—Si (silicon), Sn—Ag—Cu, can be used. Incidentally, the joint material, such as the above-described adhesives or solder, can be appropriately selected in view of each material or thermal expansion coefficient of the base 2, the elastic member 14 and the frame 3, not limited to above. In a case of requiring higher reliability of joints between the base 2 and the elastic member 14 and between the elastic member 14 and the frame 3, metal solder or solder is preferably used for the joint.

Further, in a case of making much account of characteristics of the light emitting device, caulking is preferably used for the joint in order to prevent displacement of the frame 3 and the elastic member 14 due to joint material. By using caulking, the frame 3 can be positioned unambiguously to suppress displacement or tilting of the frame 3 during assembling the package for accommodating light emitting chip, thereby joining them so that the center axes of the elastic member 14 and the frame 3 can coincide with each other. Consequently, the optical axis of the light emitting chip 4 can precisely coincide with the center axis of the frame 3 for reflecting light during assembling the package for accommodating light emitting chip, thereby manufacturing the light emitting device with desired distribution of optical intensity, distribution of illumination, and radiation color.

Furthermore, the relation of thermal expansion coefficients of the elastic member 14 and the frame 3 preferably satisfies $\alpha 1 < \alpha 2$, wherein $\alpha 1$ is thermal expansion coefficient of the elastic member 14, and $\alpha 2$ is thermal expansion coefficient of the frame 3. Hence, the elastic member 14 can reduce the difference in thermal expansion coefficient between the frame 3 and the base 2, thereby effectively preventing stress due to the difference in thermal expansion coefficient from occurring in the base 2, the frame 3 and the elastic member 14, and relieving stress due to thermal expansion and thermal absorption during assembling the package for accommodating light emitting chip or operating the light emitting device to suppress tilting or deformation of the frame 3.

As described above, in the package for accommodating light emitting chip, according to the present invention, the light emitting chip 4 is mounted on the top surface of the base 2, and the light emitting chip 4 can be electrically connected through boding wires, such as Au, Al, or wiring conductors to an external electric circuit located outside the package for accommodating light emitting chip. The first light transmitting member 5 is formed to cover the side or upper face of the light emitting chip 4 or all the light emitting chip 4 by filling the inside of the frame 3 with a transparent material, such as transparent resin, and curing it. The second light transmitting member 7 is formed with a space between the first and second light transmitting members 5 and 7, and then, if needed, a transparent cover (not shown) may be joined onto the upper face of the frame 3 using solder or resin adhesive, resulting in the light emitting device according to the present invention. Alternatively, after forming the first light transmitting member 5, the third light transmitting member G may be formed of, e.g., silicone resin, followed by forming the second light transmitting member 7 to cover all the first light transmitting member 5, and then, if needed, a transparent cover may be joined onto the upper face of the frame 3 using solder or resin adhesive, resulting in the light emitting device according to the present invention, which can convert in wavelength the light from the light emitting chip 4 to radiate light having a desired spectrum.

Moreover, as to arrangement of the light emitting device according to the present invention, a single light emitting device can be located with a desired arrangement as a light source, or a plurality of light emitting devices can be located with a lattice, stagger or radial arrangement or a plurality of groups of light emitting devices can be located concentrically with a circular or polygonal arrangement as a light source, so as to constitute the illumination apparatus according to the present invention, which has reduced variation of intensity as compared to conventional illumination apparatus.

In addition, the light emitting device according to the present invention is located in desired arrangement as a light source, and then a reflective auxiliary, an optical lens, or an optical diffusing plate, which can be designed in a desired shape, is located around the light emitting device, thereby achieving the illumination apparatus which can radiate light having an appropriate distribution of light.

Incidentally, the present invention is not limited to the above-described embodiments, and can be variously modified without departing from the gist of the present invention. For example, an optical lens, which can appropriately converge or diverge the light from the light emitting device, or a planer transparent cover may be joined using solder or resin adhesive to extract light with a desired radiation angle, thereby improving long term reliability. Moreover, in order to suppress optical loss due to bonding wires, metallized wiring may be formed on the substrate 1, and the light emitting chip 3 may be electrically connected via solder onto the metallized wiring using flip-chip mounting in the light emitting device.

The above-described light emitting device according to each embodiment is located in desired arrangement as a light source, and then a reflective auxiliary, an optical lens, or an optical diffusing plate, which can be designed in a desired shape, is located around the light emitting device, thereby achieving the illumination apparatus which can radiate light having an appropriate distribution of light.

Figure 14:
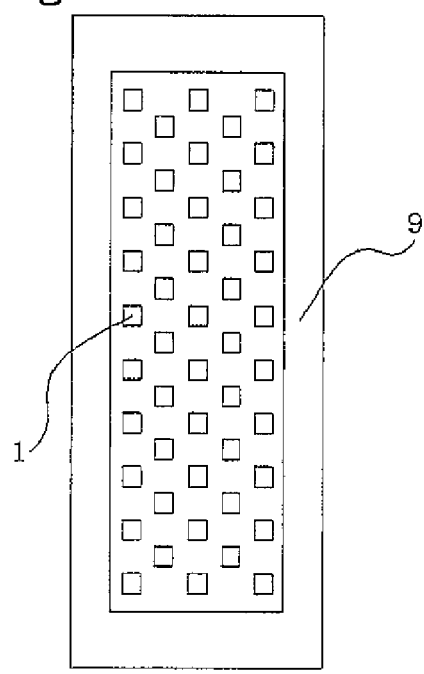
FIG. 14 is a plan view showing an example of an illumination apparatus in which light emitting devices according to the present invention are arranged in array.
Figure 15:
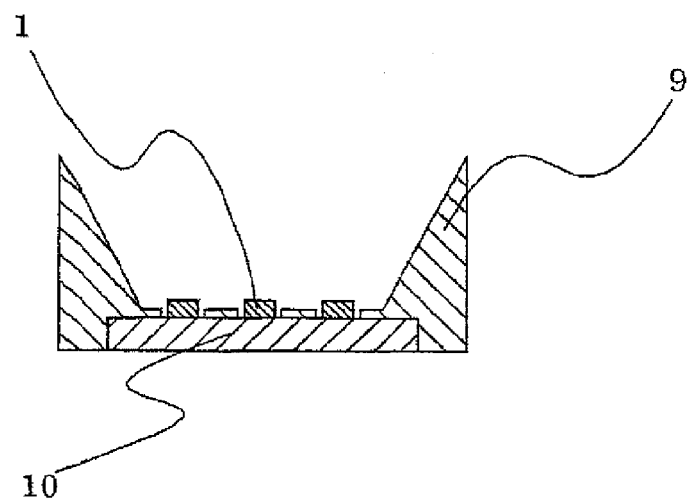
FIG. 15 is a cross-sectional view showing the illumination apparatus shown in FIG. 14.

For example, as shown in a plan view of FIG. 14 and a cross sectional view of FIG. 15, in a case of an illumination apparatus in which a plurality of light emitting devices 1 are arranged in plural lines on a driver circuit board for light emitting device 10, and a reflective auxiliary 9, which can be designed in a desired shape, is located around the light emitting device 1, the plurality of light emitting devices 1 are preferably arranged in plural lines with a staggered fashion so that distance between the adjacent light emitting devices 1 is not minimized.

When the light emitting devices 1 are arranged in a lattice fashion, the light emitting devices 1 are arranged in line to enhance the glare, which may cause discomfort in human eyesight. Meanwhile, staggered arrangement can suppress the glare to relieve the discomfort in human eyesight.

Furthermore, as the distance between the adjacent light emitting devices 1 becomes longer, thermal interference between the adjacent light emitting devices 1 can be effectively suppressed and muffling of heat in the driver circuit board for light emitting device 10 on which the light emitting devices 1 are mounted can be suppressed, thereby effectively dissipating the heat outside the light emitting devices 1. Consequently, an illumination apparatus having long-term stable optical characteristics and long life without causing discomfort in human eyesight can be manufactured.

Figure 16:
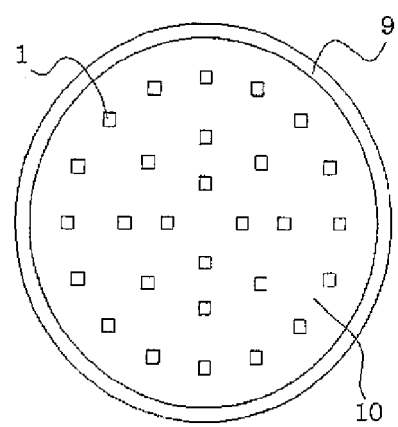
FIG. 16 is a plan view showing another example of an illumination apparatus in which light emitting devices according to the present invention are arranged in a circular form.
Figure 17:
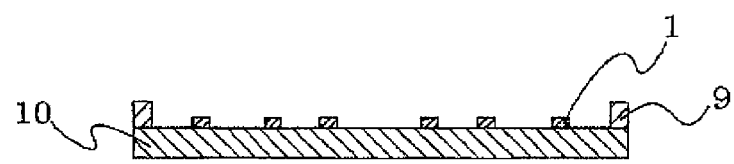
FIG. 17 is a cross-sectional view showing the illumination apparatus shown in FIG. 16.
Figure 18:
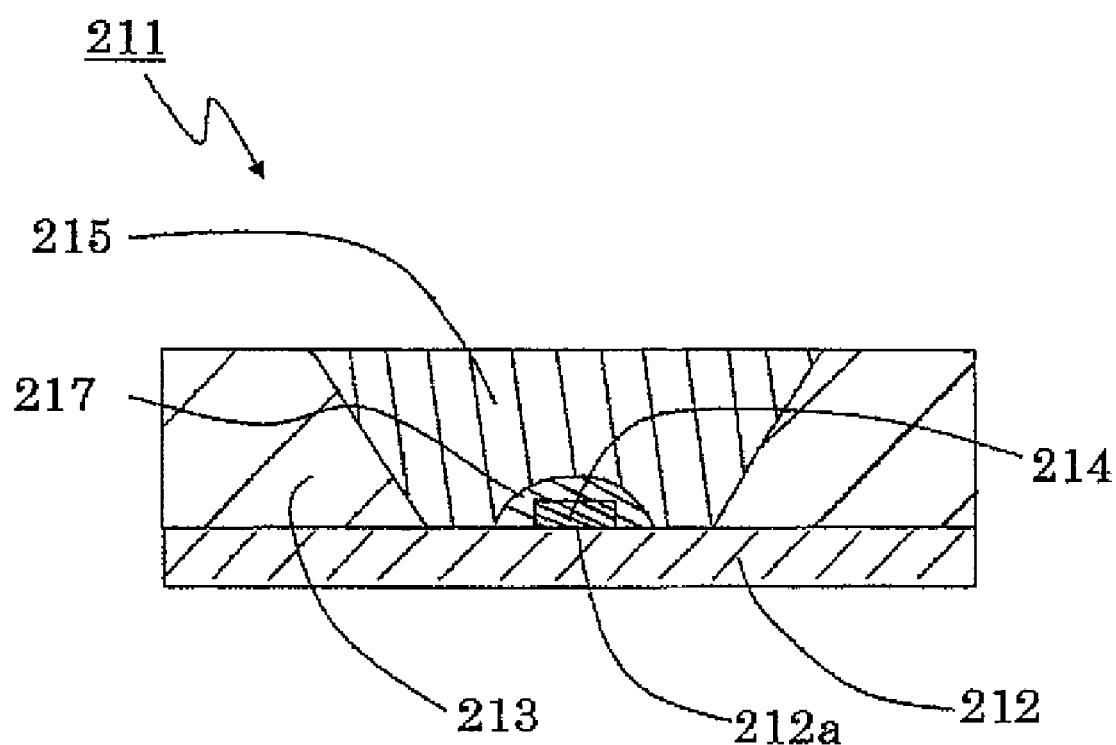
FIG. 18 is a cross-sectional view showing an example of a conventional light emitting device.

Further, as shown in a plan view of FIG. 16 and a cross sectional view of FIG. 17, in another case where a plurality of groups of light emitting devices are located concentrically with a circular or polygonal arrangement on the driver circuit board for light emitting device 10, the number of light emitting devices belonging to one group of circle or polygon is preferably increased as located from the center to the outer periphery of the illumination apparatus. Hence, the more number of the light emitting devices 1 can be located while keeping an appropriate distance between the light emitting devices 1, thereby further enhancing illuminance of the illumination apparatus.

Furthermore, providing sparsely the light emitting devices 1 in the center of the illumination apparatus can suppress muffling of heat in the center of the driver circuit board for light emitting device 10, thereby achieving uniform distribution of temperature in the driver circuit board for light emitting device 10, and prompting thermal transfer to an external electric circuit board or a heat sink to suppress rise in temperature of the light emitting devices 1. Consequently, an illumination apparatus having long-term stable optical characteristics and long life can be manufactured.

The illumination apparatus can be used for, e.g., indoor or outdoor general illuminators, chandelier illuminators, home illuminators, office illuminators, display or exhibition illuminators, street illuminators, guidance illuminators, traffic signals, stage and studio illuminators, advertising lamps, illuminator poles, submersible luminaire lights, strobe lights, spot lights, security illuminators embedded in utility poles, emergency illuminators, portable lights, electric bulletin boards, dimmer lights, flashers, back lights for display, movie devices, decorations, illumination switches, optical sensors, medical lights, in-vehicle lights, etc.

The present invention is not limited to the above-described embodiments and examples, and can be variously modified without departing from the gist of the present invention.

INDUSTRIAL APPLICABILITY

The present invention can realize a light emitting apparatus and an illumination apparatus having higher light extraction efficiency, higher optical intensity of radiation, and higher axial luminosity and brightness, thereby standing the industry in good stead.

The invention claimed is:

1. A light emitting device comprising:
a base on which a wiring conductor is formed from the top surface to the bottom surface or the side face thereof; a light emitting chip mounted on the top surface of the base and electrically connected with the wiring conductor;
a first light transmitting member which covers the light emitting chip;
a second light transmitting member provided above the first light transmitting member to cover the first light transmitting member, the second light transmitting member being formed of a light transmitting material containing fluorescent materials for converting in wavelength the light emitted from the light emitting chip; and
a third light transmitting member provided between the first and second light transmitting members,
wherein the refractive index n1 of the first light transmitting member, the refractive index n2 of the second light transmitting member and the refractive index n3 of the third light transmitting member satisfy the relation: $n3<n1$ and $n3<n2$.

2. The light emitting device according to claim 1, wherein the third light transmitting member is formed of a gaseous layer.

3. The light emitting device according to claim 1, wherein a fourth light transmitting member having an refractive index n4 is formed in contact with the lower face of the second light transmitting member, wherein the refractive indices n2 and n4 satisfy the relation: $n2>n4$.

4. The light emitting device according to claim 1, wherein the first light transmitting member is made of silicone resin.

5. The light emitting device according to claim 1, wherein the second light transmitting member is made of silicone resin containing fluorescent material.

6. The light emitting device according to claim 1, wherein a reflective member is adhered onto the periphery of the base so as to enclose the light emitting chip, and the reflective member has an optically-reflective inner surface.

7. The light emitting device according to claim 1, wherein the upper face of the first light transmitting member has a concave shape.

8. The light emitting device according to claim 1, wherein the upper face of the first light transmitting member has a convex shape.

9. The light emitting device according to claim 1, wherein the first light transmitting member is provided only on the upper face and the side face of the light emitting chip.

10. The light emitting device according to claim 1, wherein the light emitting chip has a main peak of emission in a near-ultraviolet or ultraviolet range.

11. An illumination apparatus employing the light emitting device according to any one of claims 1 to 10, as a light source.

* * * * *